(12) United States Patent
Hirai et al.

(10) Patent No.: US 10,590,234 B2
(45) Date of Patent: Mar. 17, 2020

(54) ORGANIC SEMICONDUCTOR ELEMENT, MANUFACTURING METHOD THEREOF, ORGANIC SEMICONDUCTOR COMPOSITION, AND ORGANIC SEMICONDUCTOR FILM

(71) Applicant: FUJIFILM CORPORATION, Minato-ku, Tokyo (JP)

(72) Inventors: Yuki Hirai, Kanagawa (JP); Kensuke Masui, Kanagawa (JP)

(73) Assignee: FUJIFILM CORPORATION, Tokyo (JP)

( * ) Notice: Subject to any disclaimer, the term of this patent is extended or adjusted under 35 U.S.C. 154(b) by 27 days.

(21) Appl. No.: 15/497,222

(22) Filed: Apr. 26, 2017

(65) Prior Publication Data

US 2017/0226281 A1      Aug. 10, 2017

Related U.S. Application Data

(63) Continuation of application No. PCT/JP2015/084494, filed on Dec. 9, 2015.

(30) Foreign Application Priority Data

Dec. 16, 2014    (JP) .................................. 2014-253805

(51) Int. Cl.
*C08G 61/12* (2006.01)
*H01L 51/00* (2006.01)
(Continued)

(52) U.S. Cl.
CPC ......... *C08G 61/123* (2013.01); *C08G 61/124* (2013.01); *C08G 61/125* (2013.01);
(Continued)

(58) Field of Classification Search
CPC .. C08G 61/123; C08G 61/124; C08G 61/125; C08G 61/126; H01L 29/786;
(Continued)

(56) References Cited

FOREIGN PATENT DOCUMENTS

| JP | 2009-54810 A | 3/2009 |
| JP | 2009-190999 A | 8/2009 |
| JP | 2010-177642 A | 8/2010 |

OTHER PUBLICATIONS

Takimiya et al. "Thienoacene-based Organic Semiconductors". Advanced Materials.2011, 23, 4347-4370. (Year: 2011).*

\* cited by examiner

*Primary Examiner* — Khanh T Nguyen
(74) *Attorney, Agent, or Firm* — SOLARIS Intellectual Property Group, PLLC

(57) ABSTRACT

Objects of the present invention are to provide an organic semiconductor element having excellent coating manufacturing process suitability, excellent carrier mobility, excellent heat resistance, and excellent flexibility of a semiconductor active layer and to provide an organic semiconductor composition that can form an organic semiconductor having excellent coating manufacturing process suitability, excellent carrier mobility, excellent heat resistance and excellent flexibility, an organic semiconductor film in which the composition is used, and a method of manufacturing an organic semiconductor element.
The organic semiconductor element according to the present invention includes a compound represented by Formula 1 in a semiconductor active layer. In Formula 1, A is an aromatic ring selected from any one of aromatic rings represented by Formula 2 or 3, *'s represent bonding positions to two side chalcogenophene rings, $X^a$'s represent chalcogen atoms, one of $X^1$ and $Y^1$ is a chalcogen atom, and one of $X^2$ and $Y^2$ is a chalcogen atom.

(Continued)

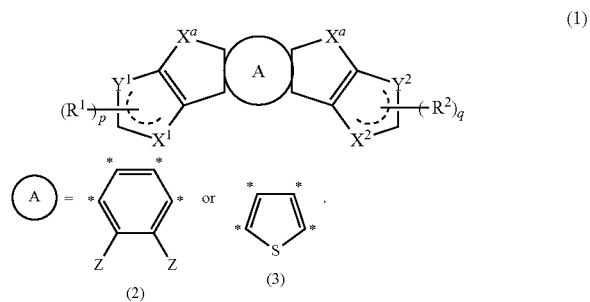
18 Claims, 1 Drawing Sheet
(51) Int. Cl.
*H01L 29/786* (2006.01)
*H01L 51/05* (2006.01)
(52) U.S. Cl.
CPC .......... C08G 61/126 (2013.01); H01L 29/786 (2013.01); H01L 51/0074 (2013.01); H01L 51/0529 (2013.01); *H01L 51/052* (2013.01); *H01L 51/0558* (2013.01)
(58) Field of Classification Search
CPC ............. H01L 51/0074; H01L 51/0529; H01L 51/052; H01L 51/0558
USPC ........................................................ 252/500
See application file for complete search history.

ORGANIC SEMICONDUCTOR ELEMENT, MANUFACTURING METHOD THEREOF, ORGANIC SEMICONDUCTOR COMPOSITION, AND ORGANIC SEMICONDUCTOR FILM

CROSS-REFERENCE TO RELATED APPLICATIONS

This application is a Continuation of International Application No. PCT/JP2015/084494 filed on Dec. 9, 2015, which claims priority to Japanese Patent Application No. 2014-253805 filed on Dec. 16, 2014. The entire contents of these applications are incorporated herein by reference.

BACKGROUND OF THE INVENTION

1. Field of the Invention

The present invention relates to an organic semiconductor element, a manufacturing method thereof, an organic semiconductor composition, and an organic semiconductor film.

2. Description of the Related Art

An organic transistor having an organic semiconductor film (semiconductor active layer) is used in a field effect transistor (FET) used in a liquid crystal display or an organic electroluminescence (EL) display, a radio frequency identifier (RFID, RF Tag), and the like, because lightening of weight, cost reduction, and flexibilization can be achieved.

As an organic transistor material in the related art, those disclosed in JP2009-54810A, JP2010-177642A, and JP2009-190999A are known.

SUMMARY OF THE INVENTION

An object to be achieved by the present invention is to provide an organic semiconductor element having excellent coating manufacturing process suitability, excellent carrier mobility, excellent heat resistance, and flexibility of a semiconductor active layer.

Another object to be achieved by the present invention is to provide an organic semiconductor composition that can form an organic semiconductor having excellent coating manufacturing process suitability, excellent carrier mobility, excellent heat resistance, and excellent flexibility, and an organic semiconductor film in which the composition is used, and a method of manufacturing an organic semiconductor element.

The object of the present invention is solved by the means described in <1>, <15>, <17>, or <18> below. <2> to <14>, and <16> which are preferable embodiments are also described below.

<1> An organic semiconductor element comprising: a compound represented by Formula 1 below in a semiconductor active layer,

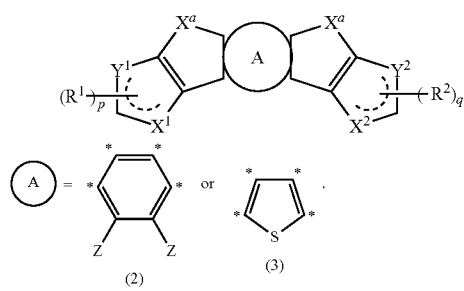

in Formula 1, A represents a central aromatic ring and is an aromatic ring selected from any one of aromatic rings represented by Formula 2 or 3, *'s represent bonding positions to two side chalcogenophene rings, and $X^a$'s represent chalcogen atoms, one of $X^1$ and $Y^1$ is a chalcogen atom and the other is $C(R^a)$, one of $X^2$ and $Y^2$ is a chalcogen atom and the other is $C(R^b)$, $R^a$'s each independently represent a hydrogen atom or $R^1$, $R^b$'s each independently represent a hydrogen atom or $R^2$, in a case where A is an aromatic ring represented by Formula 3, $Y^1$ and $Y^2$ are each independently a chalcogen atom, $X^1$ is $C(R^a)$, and $X^2$ is $C(R^b)$, p and q each independently represent an integer of 0 to 2, Z's each independently represent a hydrogen atom or a halogen atom, and $R^1$ and $R^2$ each independently represent a halogen atom or a group represented by Formula W below,

—S-L-T  (W)

in Formula W, S represents a single bond or —$(C(R^S)_2)_n$—, $R^S$'s each independently represent a hydrogen atom or a halogen atom, n represents an integer of 1 to 17, L represents a single bond, a divalent linking group represented by any one of Formulae L-1 to L-15 below, or a divalent linking group obtained by bonding two or more divalent linking groups represented by any one of Formulae L-1 to L-15 below, and T represents an alkyl group, a haloalkyl group, a cyano group, a vinyl group, an ethynyl group, an aryl group, a heteroaryl group, an oxyethylene group, an oligooxyethylene group in which a repetition number of oxyethylene units is two or greater, a siloxane group, an oligosiloxane group having two or more silicon atoms, or a trialkylsilyl group, and

 (L-1)

 (L-2)

 (L-3)

 (L-4)

 (L-5)

 (L-6)

 (L-7)

-continued

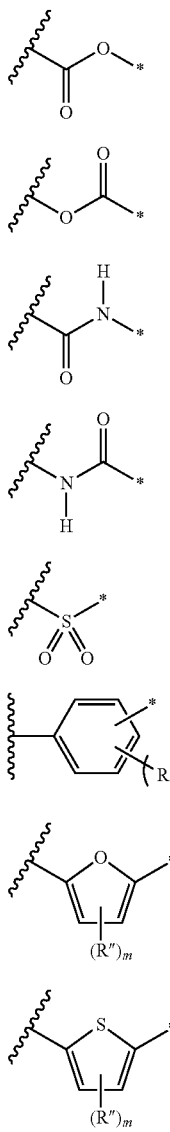

(L-8)

(L-9)

(L-10)

(L-11)

(L-12)

(L-13)

(L-14)

(L-15)

in Formulae L-1 to L-15, a wavy line portion represents a bonding position to S or another divalent linking group represented by any one of Formulae L-1 to L-15, * represents a bonding position to T or another divalent linking group represented by any one of Formulae L-1 to L-15, m in Formula L-13 represents an integer of 0 to 4, m's in Formulae L-14 and L-15 each represent an integer of 0 to 2, R″s in Formulae L-1 and L-2 each independently represent a hydrogen atom or a substituent, and R‴'s in Formulae L-13, L-14, and L-15 each independently represent a substituent.

<2> The organic semiconductor element according to <1>, in which both of $X^1$ and $X^2$ are chalcogen atoms, or both of $Y^1$ and $Y^2$ are chalcogen atoms.

<3> The organic semiconductor element according to <1> or <2>, in which Z is a hydrogen atom.

<4> The organic semiconductor element according to any one of <1> to <3>, in which p and q are each independently 1 or 2.

<5> The organic semiconductor element according to any one of <1> to <4>, in which both of p and q are 1.

<6> The organic semiconductor element according to <5>, in which substitution positions of $R^1$ and $R^2$ are respectively second positions of terminal chalcogenophene rings.

<7> The organic semiconductor element according to any one of <1> to <6>, in which $X^a$ is a S atom.

<8> The organic semiconductor element according to any one of <1> to <7>, in which both of two terminal chalcogenophene rings in Formula 1 are thiophene rings.

<9> The organic semiconductor element according to any one of <1> to <8>, in which a sum of the numbers of carbon atoms in the group represented by Formula W is 4 to 40.

<10> The organic semiconductor element according to any one of <1> to <9>, in which L is a divalent linking group represented by any one of Formulae L-1 to L-4 and L-13 to L-15, or a divalent linking group obtained by bonding two or more divalent linking groups represented by any one of Formulae L-1 to L-4 and L-13 to L-15.

<11> The organic semiconductor element according to any one of <1> to <10>, in which L is a divalent linking group represented by any one of Formulae L-1 to L-4 and L-13 to L-15 singly.

<12> The organic semiconductor element according to any one of <1> to <11>, in which T is an alkyl group.

<13> The organic semiconductor element according to any one of <1> to <12>, in which W is an alkyl group.

<14> The organic semiconductor element according to any one of <1> to <13>, which is an organic thin film transistor.

<15> An organic semiconductor composition comprising: a compound represented by Formula 1 below; and a solvent having a boiling point of 100° C. or higher, in which a content of the compound represented by Formula 1 is 20 mass % or less with respect to a total amount of the organic semiconductor composition,

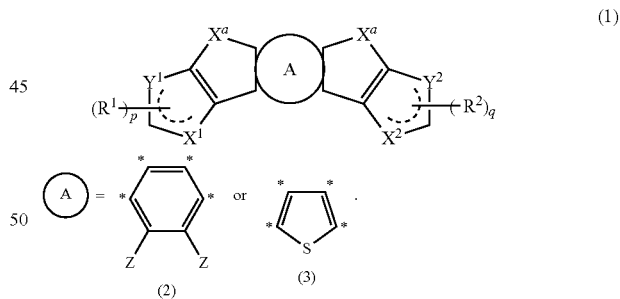

in Formula 1, A represents a central aromatic ring and is an aromatic ring selected from any one of aromatic rings represented by Formula 2 or 3, *'s represent bonding positions to two side chalcogenophene rings, and $X^a$'s represent chalcogen atoms, one of $X^1$ and $Y^1$ is a chalcogen atom and the other is $C(R^a)$, one of $X^2$ and $Y^2$ is a chalcogen atom and the other is $C(R^b)$, $R^a$'s each independently represent a hydrogen atom or $R^1$, $R^b$'s each independently represent a hydrogen atom or $R^2$, in a case where A is an aromatic ring represented by Formula 3, $Y^1$ and $Y^2$ are each independently a chalcogen atom, $X^1$ is $C(R^a)$, and $X^2$ is $C(R^b)$, p and q each independently represent an integer of 0 to 2, Z's each independently represent a hydrogen atom or a halogen atom, and $R^1$ and $R^2$ each independently represent a halogen atom or a group represented by Formula W below,

—S-L-T     (W)

in Formula W, S represents a single bond or an alkylene group —$(C(R^S)_2)_n$—, $R^S$'s each independently represent a hydrogen atom or a halogen atom, n represents an integer of 1 to 17, L represents a single bond, a divalent linking group represented by any one of Formulae L-1 to L-15 below, or a divalent linking group obtained by bonding two or more divalent linking groups represented by any one of Formulae L-1 to L-15 below, and T represents an alkyl group, a haloalkyl group, a cyano group, a vinyl group, an ethynyl group, an aryl group, a heteroaryl group, an oxyethylene group, an oligooxyethylene group in which a repetition number of oxyethylene units is two or greater, a siloxane group, an oligosiloxane group having two or more silicon atoms, or a trialkylsilyl group, and

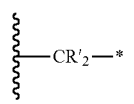

(L-1)

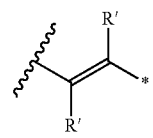

(L-2)

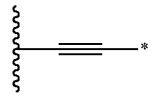

(L-3)

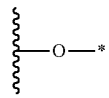

(L-4)

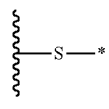

(L-5)

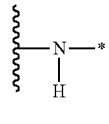

(L-6)

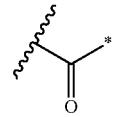

(L-7)

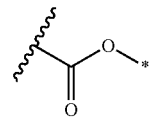

(L-8)

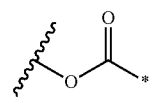

(L-9)

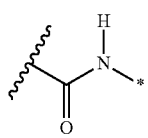

(L-10)

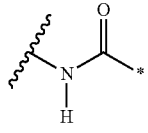

(L-11)

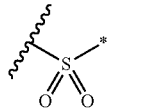

(L-12)

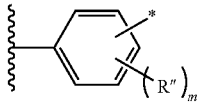

(L-13)

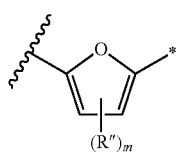

(L-14)

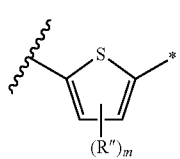

(L-15)

in Formulae L-1 to L-15, a wavy line portion represents a bonding position to S or another divalent linking group represented by any one of Formulae L-1 to L-15, * represents a bonding position to T or another divalent linking group represented by any one of Formulae L-1 to L-15, m in Formula L-13 represents an integer of 0 to 4, m's in Formulae L-14 and L-15 each represent an integer of 0 to 2, R''s in Formulae L-1 and L-2 each independently represent a hydrogen atom or a substituent, and R'''s in Formulae L-13, L-14, and L-15 each independently represent a substituent.

<16> The organic semiconductor composition according to <15>, further comprising: a binder polymer, in which a content of the binder polymer is 0.001 to 10 mass % with respect to a total amount of the organic semiconductor composition.

<17> A method of manufacturing an organic semiconductor element, comprising: an applying step of applying the organic semiconductor composition according to <15> or <16> to a substrate by an ink jet method or a flexographic printing method and a removing step of removing at least a portion of the solvent from the applied organic semiconductor composition.

<18> An organic semiconductor film formed from the organic semiconductor composition according to <15> or <16>.

According to the present invention, it is possible to provide an organic semiconductor element having excellent coating manufacturing process suitability, excellent carrier mobility, excellent heat resistance, and excellent flexibility of a semiconductor active layer.

According to the present invention, it is possible to provide an organic semiconductor composition that can form an organic semiconductor having excellent coating manufacturing process suitability, excellent carrier mobility, excellent heat resistance, and excellent flexibility, and an organic semiconductor film, and a method of manufacturing an organic semiconductor element in which the composition is used.

DESCRIPTION OF THE PREFERRED EMBODIMENTS

Figure 1:
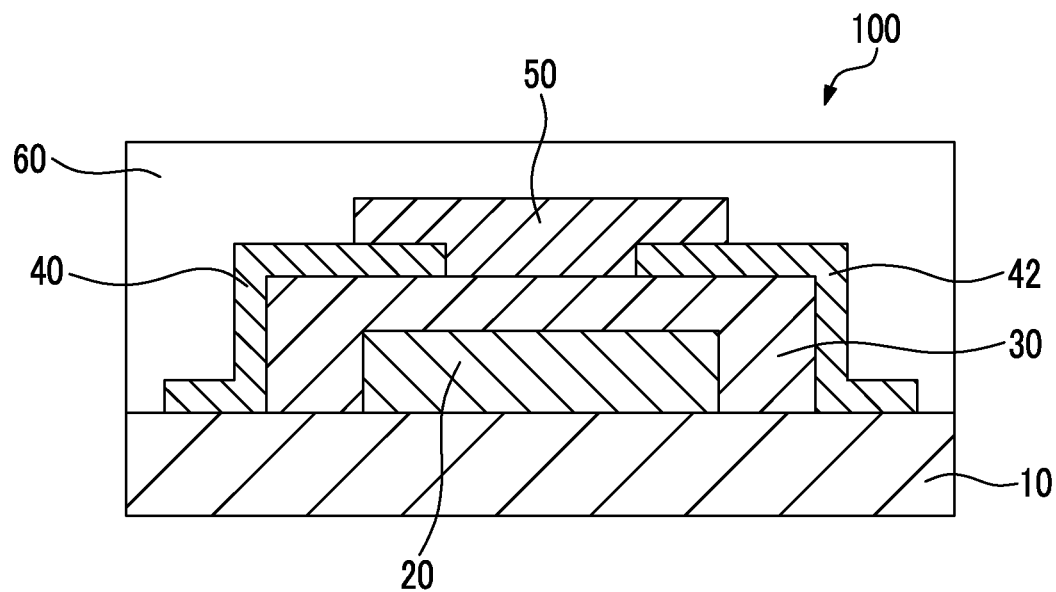
FIG. 1 is a schematic cross-sectional view of an aspect of an organic semiconductor element of the present invention.

Hereinafter, the contents of the present invention will be specifically described. The constituents in the following description will be explained based on typical embodiments of the present invention, but the present invention is not limited to the embodiments. In the specification of the present application, "to" is used to mean that the numerical values listed before and after "to" are a lower limit and an upper limit respectively.

In the present specification, in a case where there is no description regarding whether a group (atomic group) is substituted or unsubstituted, the group includes both of a group having a substituent and a group not having a substituent. For example, an "alkyl group" includes not only an alkyl group not having a substituent (unsubstituted alkyl group) but also an alkyl group having a substituent (substituted alkyl group).

In the present specification, in some cases, a chemical structural formula is described as a simplified structural formula in which a hydrogen atom is omitted.

In the present invention, "mobility" refers to "carrier mobility" and means any one or both of electron mobility and hole mobility.

In the present invention, "mass %" and "weight %" have the same definition, and "part by mass" and "part by weight" have the same definition.

In the present invention, a combination of preferred aspects is more preferable.

(Organic Semiconductor Element)

An organic semiconductor element according to the present invention includes a compound represented by Formula 1 below in a semiconductor active layer.

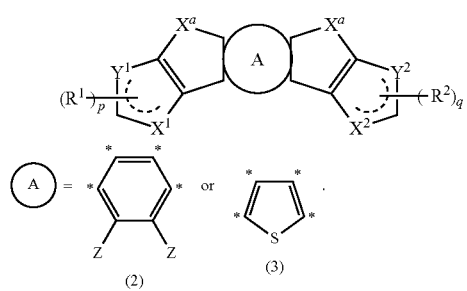

(1)

In Formula 1, A represents a central aromatic ring and is an aromatic ring selected from any one of aromatic rings represented by Formula 2 or 3, *'s represent bonding positions to two side chalcogenophene rings, and $X^a$'s represent chalcogen atoms, one of $X^1$ and $Y^1$ is a chalcogen atom and the other is $C(R^a)$, one of $X^2$ and $Y^2$ is a chalcogen atom and the other is $C(R^b)$, $R^a$'s each independently represent a hydrogen atom or $R^1$, $R^b$'s each independently represent a hydrogen atom or $R^2$, in a case where A is an aromatic ring represented by Formula 3, $Y^1$ and $Y^2$ are each independently a chalcogen atom, $X^1$ is $C(R^a)$, and $X^2$ is $C(R^b)$, and p and q each independently represent an integer of 0 to 2, Z's each independently represent a hydrogen atom or a halogen atom, and $R^1$ and $R^2$ each independently represent a halogen atom or a group represented by Formula W below.

$$\text{—S-L-T} \quad (W)$$

In Formula W, S represents a single bond or $—(C(R^S)_2)_n—$, $R^S$'s each independently represent a hydrogen atom or a halogen atom, n represents an integer of 1 to 17, L represents a single bond, a divalent linking group represented by any one of Formulae L-1 to L-15 below, or a divalent linking group obtained by bonding two or more divalent linking groups represented by any one of Formulae L-1 to L-15 below, and T represents an alkyl group, a haloalkyl group, a cyano group, a vinyl group, an ethynyl group, an aryl group, a heteroaryl group, an oxyethylene group, an oligooxyethylene group in which a repetition number of oxyethylene units is 2 or greater, a siloxane group, an oligosiloxane group having two or more silicon atoms, or a trialkylsilyl group.

(L-1)

(L-2)

(L-3)

(L-4)

(L-5)

(L-6)

(L-7)

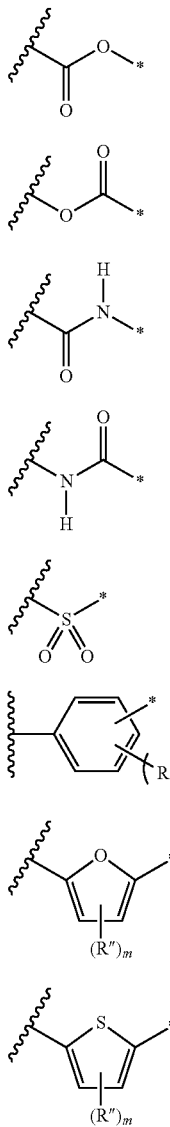

In Formulae L-1 to L-15, a wavy line portion represents a bonding position to S or another divalent linking group represented by any one of Formulae L-1 to L-15, * represents a bonding position to T or another divalent linking group represented by any one of Formulae L-1 to L-15, m in Formula L-13 represents an integer of 0 to 4, m's in Formulae L-14 and L-15 each represent an integer of 0 to 2, R"s in Formulae L-1 and L-2 each independently represent a hydrogen atom or a substituent, and R'"s in Formulae L-13, L-14, and L-15 each independently represent a substituent.

As a result of diligent research by the present inventors, the present inventors have found that, if a compound represented by Formula 1 was contained in a semiconductor active layer, it was possible to obtain an organic semiconductor element having excellent coating manufacturing process suitability, excellent carrier mobility, excellent heat resistance, and excellent flexibility (flexible properties) of a semiconductor active layer, so as to complete the present invention.

The mechanism of exhibiting a specific effect is not clear. However, it is assumed that the effect of the present invention was exhibited since a compound represented by Formula 1 had a specific fused polycyclic aromatic ring structure.

Hereinafter, an organic semiconductor element according to the present invention is described.

<Compound Represented by Formula 1>

The organic semiconductor element according to the present invention includes a compound represented by Formula 1 above in a semiconductor active layer.

The compound represented by Formula 1 is an organic semiconductor compound.

A represents a central aromatic ring and is an aromatic ring selected from any one of aromatic rings represented by Formula 2 or 3, and *'s represent bonding positions to two side chalcogenophene rings.

In view of mobility, A is preferably an aromatic ring represented by Formula 2.

$X^a$ represents a chalcogen atom (an O atom, a S atom, a Se atom, and a Te atom), is preferably a S atom or a Se atom, and is more preferably a S atom. In the aforementioned aspect, carrier mobility of the obtained organic semiconductor film is more excellent.

One of $X^1$ and $Y^1$ is a chalcogen atom and the other is $C(R^a)$, one of $X^2$ and $Y^2$ is a chalcogen atom and the other is $C(R^b)$, $R^a$'s each independently represent a hydrogen atom or $R^1$, $R^b$'s each independently represent a hydrogen atom or $R^2$, in a case where A is an aromatic ring represented by Formula 3, $Y^1$ and $Y^2$ are each independently a chalcogen atom, $X^1$ is $C(R^a)$, and $X^2$ is $C(R^b)$.

It is preferable that both of $X^1$ and $X^2$ are chalcogen atoms, or both of $Y^1$ and $Y^2$ are chalcogen atoms.

$X^1$, $Y^1$, $X^2$, and $Y^2$ represent chalcogen atoms (O atoms, S atoms, Se atoms, and Te atoms), is preferably represent S atoms or Se atoms, and is more preferably represent S atoms. In the aforementioned aspect, carrier mobility of the obtained organic semiconductor film is more excellent.

In a case where A is an aromatic ring represented by Formula 2, it is preferable that $X^1$ and $X^2$ are each independently a chalcogen atom, $Y^1$ is $C(R^a)$, and $Y^2$ is $C(R^b)$. In the aforementioned aspect, carrier mobility of the obtained organic semiconductor film is more excellent.

Dotted lines in chalcogenophene rings of respective terminal represent that conjugated chains are formed.

p and q each independently represent an integer of 0 to 2, is preferably 1 or 2, and is more preferably 1. In the aforementioned aspect, heat resistance and mobility of the obtained semiconductor active layer are more excellent, and a domain size of an organic semiconductor at the time of forming coating is excellent.

Z's each independently represent a hydrogen atom or a halogen atom and are preferably a hydrogen atom.

$R^1$ and $R^2$ each independently represent a halogen atom or a group represented by Formula W below and is preferably a group represented by Formula W below. In the aforementioned aspect, carrier mobility of the obtained organic semiconductor film is more excellent.

$$-S-L-T \qquad (W)$$

S represents a single bond or $-(C(R^S)_2)_n-$ and is preferably a single bond.

$R^S$'s each independently represent a hydrogen atom or a halogen atom and is preferably a hydrogen atom.

n represents an integer of 1 to 17, is preferably an integer of 1 to 8, and is more preferably an integer of 1 to 4.

In view of coating film formability, crystal sizes, and heat resistance of the obtained organic semiconductor film, le and $R^2$ are preferably the same groups.

The number of carbon atoms of $R^1$ is preferably 5 to 40 and more preferably 8 to 20.

The number of carbon atoms of $R^2$ is preferably 5 to 40 and more preferably 8 to 20.

L represents a single bond, a divalent linking group represented by any one of Formulae L-1 to L-15 below, or a divalent linking group obtained by bonding two or more divalent linking groups represented by any one of Formulae L-1 to L-15 below. L is preferably a divalent linking group represented by any one of Formulae L-1 to L-4 and L-13 to L-15 above or a divalent linking group obtained by bonding two or more divalent linking groups represented by any one of Formulae L-1 to L-4 and L-13 to L-15 above and is more preferably a divalent linking group represented by any one of Formulae L-1 to L-4 and L-13 to L-15 above singly.

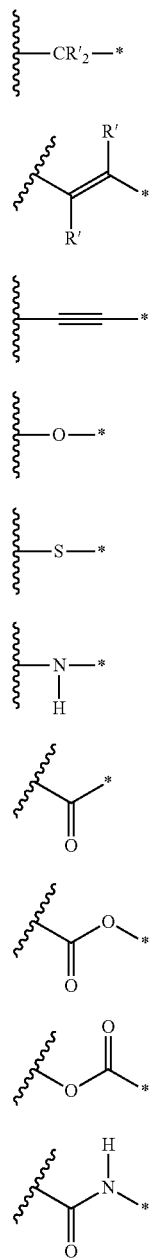
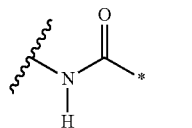
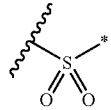
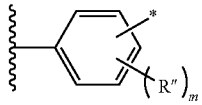
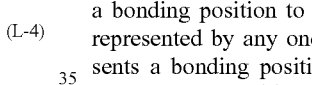
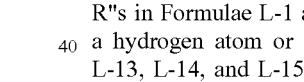
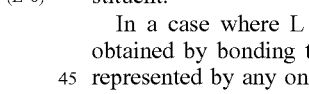
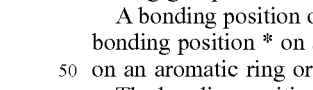
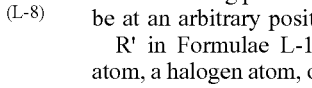
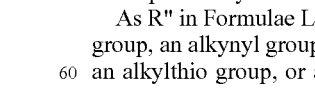

In Formulae L-1 to L-15, a wavy line portion represents a bonding position to S or another divalent linking group represented by any one of Formulae L-1 to L-15, * represents a bonding position to T or another divalent linking group represented by any one of Formulae L-1 to L-15, m in Formula L-13 represents an integer of 0 to 4, m's in Formulae L-14 and L-15 each represent an integer of 0 to 2, R''s in Formulae L-1 and L-2 each independently represent a hydrogen atom or a substituent, and R'''s in Formulae L-13, L-14, and L-15 each independently represent a substituent.

In a case where L represents a divalent linking group obtained by bonding two or more divalent linking groups represented by any one of Formulae L-1 to L-15, * of one linking group is bonded to a wavy line portion of another linking group.

A bonding position of R' in Formulae L-13 to L-15 and a bonding position * on a T side can be at arbitrary positions on an aromatic ring or a hetero aromatic ring.

The bonding position * on the T side in Formula L-13 can be at an arbitrary position on an aromatic ring.

R' in Formulae L-1 and L-2 is preferably a hydrogen atom, a halogen atom, or an alkyl group and more preferably a hydrogen atom.

m's in Formulae L-13 to L-15 are preferably 0 or 1 and more preferably 0.

As R'' in Formulae L-13 to L-15, a halogen atom, an alkyl group, an alkynyl group, an alkenyl group, an alkoxy group, an alkylthio group, or an aryl group is preferable.

T represents an alkyl group, a haloalkyl group, a cyano group, a vinyl group, an ethynyl group, an aryl group, a heteroaryl group, an oxyethylene group, an oligooxyethylene group in which a repetition number of oxyethylene units is 2 or greater, a siloxane group, an oligosiloxane group having two or more silicon atoms, or a trialkylsilyl group, is preferably an alkyl group, a vinyl group, or an ethynyl group, is more preferably an alkyl group, is even more preferably an alkyl group having 5 to 19 carbon atoms, and is particularly preferably an alkyl group having 7 to 13 carbon atoms.

An alkyl group in T is preferably a linear alkyl group.

In the group represented by Formula W above, it is preferable that L is a methylene group, and T is an alkyl group. That is, the group represented by Formula W above is preferably an alkyl group, more preferably an alkyl group having 2 to 40 carbon atoms, and more preferably an alkyl group having 2 to 18 carbon atoms. In the aforementioned aspect, coating film formability is more excellent, and carrier mobility of the obtained organic semiconductor film is more excellent.

The compound represented by Formula 1 is preferably a compound having a line symmetric axis. In the aforementioned aspect, coating film formability is more excellent, crystal sizes of obtained organic semiconductor crystals are larger, and carrier mobility of the obtained organic semiconductor film is more excellent.

The compound represented by Formula 1 is preferably a compound represented by any one of Formulae 1-1 to 1-3 below.

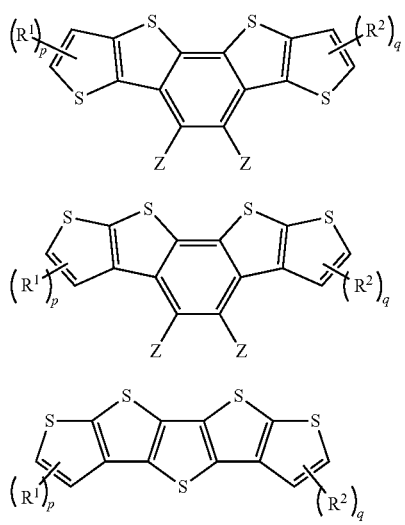

In Formulae 1-1 to 1-3, p and q each independently represent 1 or 2, Z's each independently represent a hydrogen atom or a halogen atom, $R^1$ and $R^2$ each independently represent a group represented by Formula W above.

Z in Formula 1-1 to Formula 1-3 and a group represented by Formula W are the same as Z in Formula 1 and the group represented by Formula W, and preferable aspects thereof are also the same.

p and q in Formulae 1-1 to 1-3 preferably are 1.

$R^1$ and $R^2$ in Formulae 1-1 to 1-3 are preferably the same group.

$R^1$ and $R^2$ in Formulae 1-1 to 1-3 each independently and preferably represent an alkyl group.

The number of carbon atoms of $R^1$ in Formulae 1-1 to 1-3 is preferably 2 to 40 and more preferably 2 to 18.

The number of carbon atoms of $R^2$ in Formulae 1-1 to 1-3 is preferably 2 to 40 and more preferably 2 to 18.

The compound represented by Formula 1 is more preferably a compound represented by any one of Formulae 1-4 to 1-6 below.

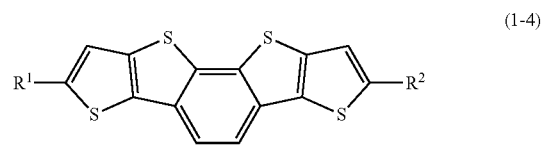

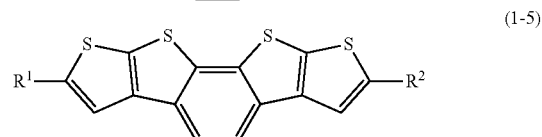

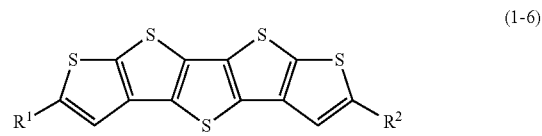

In Formulae 1-4 to 1-6, $R^1$ and $R^2$ each independently represent a group represented by Formula W above.

The group represented by Formula W in Formulae 1-4 to 1-6 is the same as the group represented by Formula W in Formula 1 and preferable aspects thereof are also the same.

$R^1$ and $R^2$ in Formulae 1-4 to 1-6 are preferably the same group.

$R^1$ and $R^2$ in Formulae 1-4 to 1-6 each independently represent and preferably an alkyl group.

The number of carbon atoms of $R^1$ in Formulae 1-4 to 1-6 is preferably 2 to 40 and more preferably 2 to 18.

The number of carbon atoms of $R^2$ in Formulae 1-4 to 1-6 is preferably 2 to 40 and more preferably 2 to 18.

Specific examples of the compound represented by Formula 1 include compounds provided below. However, it is obvious that the present invention is not limited thereto. * represents a bonding position. Xa, X, Z, $R_{11}$, $R_{12}$, $R_{21}$, and $R_{22}$ in the respective tables represent Xa, X, Z, $R_{11}$, $R_{12}$, $R_{21}$, and $R_{22}$ in the compound represented by any one of Formulae A to F.

TABLE 1

|  | Xa | X | Z | $R_{11}$ | $R_{12}$ | $R_{21}$ | $R_{22}$ |
|---|---|---|---|---|---|---|---|
| Compounds 1A to 1F | S | S | H | $C_5H_{11}$—* | H | $C_5H_{11}$—* | H |
| Compounds 2A to 2F | S | S | H | $C_6H_{13}$—* | H | $C_6H_{13}$—* | H |
| Compounds 3A to 3F | S | S | H | $C_7H_{15}$—* | H | $C_7H_{15}$—* | H |
| Compounds 4A to 4F | S | S | H | $C_8H_{17}$—* | H | $C_8H_{17}$—* | H |
| Compounds 5A to 5F | S | S | H | $C_9H_{19}$—* | H | $C_9H_{19}$—* | H |
| Compounds 6A to 6F | S | S | H | $C_{10}H_{21}$—* | H | $C_{10}H_{21}$—* | H |
| Compounds 7A to 7F | S | S | H | $C_{11}H_{23}$—* | H | $C_{11}H_{23}$—* | H |
| Compounds 8A to 8F | S | S | H | $C_{12}H_{25}$—* | H | $C_{12}H_{25}$—* | H |
| Compounds 9A to 9F | S | S | H | $C_{13}H_{27}$—* | H | $C_{13}H_{27}$—* | H |
| Compounds 10A to 10F | S | S | H | $C_{14}H_{29}$—* | H | $C_{14}H_{29}$—* | H |

TABLE 1-continued

| | Xa | X | Z | $R_{11}$ | $R_{12}$ | $R_{21}$ | $R_{22}$ |
|---|---|---|---|---|---|---|---|
| Compounds 11A to 11F | S | S | H | $C_{15}H_{31}$—* | H | $C_{15}H_{31}$—* | H |
| Compounds 12A to 12F | S | S | H | $C_{16}H_{33}$—* | H | $C_{16}H_{33}$—* | H |
| Compounds 13A to 13F | S | S | H | $C_{17}H_{35}$—* | H | $C_{17}H_{35}$—* | H |
| Compounds 14A to 14F | S | S | H | $C_{18}H_{37}$—* | H | $C_{18}H_{37}$—* | H |
| Compounds 15A to 15F | S | S | H | p-$C_5H_{11}$—Ph—* | H | p-$C_5H_{11}$—Ph—* | H |
| Compounds 16A to 16F | S | S | H | p-$C_6H_{13}$—Ph—* | H | p-$C_6H_{13}$—Ph—* | H |
| Compounds 17A to 17F | S | S | H | p-$C_7H_{15}$—Ph—* | H | p-$C_7H_{15}$—Ph—* | H |
| Compounds 18A to 18F | S | S | H | p-$C_8H_{17}$—Ph—* | H | p-$C_8H_{17}$—Ph—* | H |
| Compounds 19A to 19F | S | S | H | p-$C_9H_{19}$—Ph—* | H | p-$C_9H_{19}$—Ph—* | H |
| Compounds 20A to 20F | S | S | H | p-$C_{10}H_{21}$—Ph—* | H | p-$C_{10}H_{21}$—Ph—* | H |
| Compounds 21A to 21F | S | S | H | p-$C_{11}H_{23}$—Ph—* | H | p-$C_{11}H_{23}$—Ph—* | H |
| Compounds 22A to 22F | S | S | H | p-$C_{12}H_{25}$—Ph—* | H | p-$C_{12}H_{25}$—Ph—* | H |
| Compounds 23A to 23F | S | S | H | p-$C_{13}H_{27}$—Ph—* | H | p-$C_{13}H_{27}$—Ph—* | H |
| Compounds 24A to 24F | S | S | H | p-$C_{14}H_{29}$—Ph—* | H | p-$C_{14}H_{29}$—Ph—* | H |
| Compounds 25A to 25F | S | S | H | p-$C_{15}H_{31}$—Ph—* | H | p-$C_{15}H_{31}$—Ph—* | H |
| Compounds 26A to 26F | S | S | H | p-$C_{16}H_{33}$—Ph—* | H | p-$C_{16}H_{33}$—Ph—* | H |
| Compounds 27A to 27F | S | S | H | p-$C_{17}H_{35}$—Ph—* | H | p-$C_{17}H_{35}$—Ph—* | H |
| Compounds 28A to 28F | S | S | H | p-$C_{18}H_{37}$—Ph—* | H | p-$C_{18}H_{37}$—Ph—* | H |
| Compounds 29A to 29F | S | S | H | X1 | H | X1 | H |
| Compounds 30A to 30F | S | S | H | X2 | H | X2 | H |
| Compounds 31A to 31F | S | S | H | X3 | H | X3 | H |
| Compounds 32A to 32F | S | S | H | X4 | H | X4 | H |
| Compounds 33A to 33F | S | S | H | X5 | H | X5 | H |
| Compounds 34A to 34F | S | S | H | X6 | H | X6 | H |
| Compounds 35A to 35F | S | S | H | X7 | H | X7 | H |
| Compounds 36A to 36F | S | S | H | X8 | H | X8 | H |
| Compounds 37A to 37F | S | S | H | X9 | H | X9 | H |
| Compounds 38A to 38F | S | S | H | X10 | H | X10 | H |
| Compounds 39A to 39F | S | S | H | X11 | H | X11 | H |
| Compounds 40A to 40F | S | S | H | X12 | H | X12 | H |
| Compounds 41A to 41F | S | S | H | X13 | H | X13 | H |
| Compounds 42A to 42F | S | S | H | X14 | H | X14 | H |
| Compounds 43A to 43F | S | S | F | $C_5H_{11}$—* | H | $C_5H_{11}$—* | H |
| Compounds 44A to 44F | S | S | F | $C_6H_{13}$—* | H | $C_6H_{13}$—* | H |
| Compounds 45A to 45F | S | S | F | $C_7H_{15}$—* | H | $C_7H_{15}$—* | H |
| Compounds 46A to 46F | S | S | F | $C_8H_{17}$—* | H | $C_8H_{17}$—* | H |
| Compounds 47A to 47F | S | S | F | $C_9H_{19}$—* | H | $C_9H_{19}$—* | H |
| Compounds 48A to 48F | S | S | F | $C_{10}H_{21}$—* | H | $C_{10}H_{21}$—* | H |
| Compounds 49A to 49F | S | S | F | $C_{11}H_{23}$—* | H | $C_{11}H_{23}$—* | H |
| Compounds 50A to 50F | S | S | F | $C_{12}H_{25}$—* | H | $C_{12}H_{25}$—* | H |
| Compounds 51A to 51F | S | S | F | $C_{13}H_{27}$—* | H | $C_{13}H_{27}$—* | H |
| Compounds 52A to 52F | S | S | F | $C_{14}H_{29}$—* | H | $C_{14}H_{29}$—* | H |
| Compounds 53A to 53F | S | S | F | $C_{15}H_{31}$—* | H | $C_{15}H_{31}$—* | H |
| Compounds 54A to 54F | S | S | F | $C_{16}H_{33}$—* | H | $C_{16}H_{33}$—* | H |
| Compounds 55A to 55F | S | S | F | $C_{17}H_{35}$—* | H | $C_{17}H_{35}$—* | H |
| Compounds 56A to 56F | S | S | F | $C_{18}H_{37}$—* | H | $C_{18}H_{37}$—* | H |
| Compounds 57A to 57F | S | S | F | p-$C_5H_{11}$—Ph—* | H | p-$C_5H_{11}$—Ph—* | H |
| Compounds 58A to 58F | S | S | F | p-$C_6H_{13}$—Ph—* | H | p-$C_6H_{13}$—Ph—* | H |
| Compounds 59A to 59F | S | S | F | p-$C_7H_{15}$—Ph—* | H | p-$C_7H_{15}$—Ph—* | H |
| Compounds 60A to 60F | S | S | F | p-$C_8H_{17}$—Ph—* | H | p-$C_8H_{17}$—Ph—* | H |
| Compounds 61A to 61F | S | S | F | p-$C_9H_{19}$—Ph—* | H | p-$C_9H_{19}$—Ph—* | H |
| Compounds 62A to 62F | S | S | F | p-$C_{10}H_{21}$—Ph—* | H | p-$C_{10}H_{21}$—Ph—* | H |
| Compounds 63A to 63F | S | S | F | p-$C_{11}H_{23}$—Ph—* | H | p-$C_{11}H_{23}$—Ph—* | H |
| Compounds 64A to 64F | S | S | F | p-$C_{12}H_{25}$—Ph—* | H | p-$C_{12}H_{25}$—Ph—* | H |
| Compounds 65A to 65F | S | S | F | p-$C_{13}H_{27}$—Ph—* | H | p-$C_{13}H_{27}$—Ph—* | H |
| Compounds 66A to 66F | S | S | F | p-$C_{14}H_{29}$—Ph—* | H | p-$C_{14}H_{29}$—Ph—* | H |
| Compounds 67A to 67F | S | S | F | p-$C_{15}H_{31}$—Ph—* | H | p-$C_{15}H_{31}$—Ph—* | H |
| Compounds 68A to 68F | S | S | F | p-$C_{16}H_{33}$—Ph—* | H | p-$C_{16}H_{33}$—Ph—* | H |
| Compounds 69A to 69F | S | S | F | p-$C_{17}H_{35}$—Ph—* | H | p-$C_{17}H_{35}$—Ph—* | H |
| Compounds 70A to 70F | S | S | F | p-$C_{18}H_{37}$—Ph—* | H | p-$C_{18}H_{37}$—Ph—* | H |
| Compounds 71A to 71F | S | S | F | X1 | H | X1 | H |
| Compounds 72A to 72F | S | S | F | X2 | H | X2 | H |
| Compounds 73A to 73F | S | S | F | X3 | H | X3 | H |
| Compounds 74A to 74F | S | S | F | X4 | H | X4 | H |
| Compounds 75A to 75F | S | S | F | X5 | H | X5 | H |
| Compounds 76A to 76F | S | S | F | X6 | H | X6 | H |
| Compounds 77A to 77F | S | S | F | X7 | H | X7 | H |
| Compounds 78A to 78F | S | S | F | X8 | H | X8 | H |
| Compounds 79A to 79F | S | S | F | X9 | H | X9 | H |
| Compounds 80A to 80F | S | S | F | X10 | H | X10 | H |
| Compounds 81A to 81F | S | S | F | X11 | H | X11 | H |
| Compounds 82A to 82F | S | S | F | X12 | H | X12 | H |
| Compounds 83A to 83F | S | S | F | X13 | H | X13 | H |
| Compounds 84A to 84F | S | S | F | X14 | H | X14 | H |

TABLE 1-continued

| | Xa | X | Z | $R_{11}$ | $R_{12}$ | $R_{21}$ | $R_{22}$ |
|---|---|---|---|---|---|---|---|

(A) [structure]

(B) [structure]

(C) [structure]

(D) [structure]

(E) [structure]

(F) [structure]

TABLE 2

| | Xa | X | Z | $R_{11}$ | $R_{12}$ | $R_{21}$ | $R_{22}$ |
|---|---|---|---|---|---|---|---|
| Compounds 85A to 85F | S | S | H | H | $C_5H_{11}$—* | H | $C_5H_{11}$—* |
| Compounds 86A to 86F | S | S | H | H | $C_6H_{13}$—* | H | $C_6H_{13}$—* |
| Compounds 87A to 87F | S | S | H | H | $C_7H_{15}$—* | H | $C_7H_{15}$—* |
| Compounds 88A to 88F | S | S | H | H | $C_8H_{17}$—* | H | $C_8H_{17}$—* |
| Compounds 89A to 89F | S | S | H | H | $C_9H_{19}$—* | H | $C_9H_{19}$—* |
| Compounds 90A to 90F | S | S | H | H | $C_{10}H_{21}$—* | H | $C_{10}H_{21}$—* |
| Compounds 91A to 91F | S | S | H | H | $C_{11}H_{23}$—* | H | $C_{11}H_{23}$—* |
| Compounds 92A to 92F | S | S | H | H | $C_{12}H_{25}$—* | H | $C_{12}H_{25}$—* |
| Compounds 93A to 93F | S | S | H | H | $C_{13}H_{27}$—* | H | $C_{13}H_{27}$—* |
| Compounds 94A to 94F | S | S | H | H | $C_{14}H_{29}$—* | H | $C_{14}H_{29}$—* |
| Compounds 95A to 95F | S | S | H | H | $C_{15}H_{31}$—* | H | $C_{15}H_{31}$—* |
| Compounds 96A to 96F | S | S | H | H | $C_{16}H_{33}$—* | H | $C_{16}H_{33}$—* |
| Compounds 97A to 97F | S | S | H | H | $C_{17}H_{35}$—* | H | $C_{17}H_{35}$—* |
| Compounds 98A to 98F | S | S | H | H | $C_{18}H_{37}$—* | H | $C_{18}H_{37}$—* |
| Compounds 99A to 99F | S | S | H | H | p-$C_5H_{11}$—Ph—* | H | p-$C_5H_{11}$—Ph—* |
| Compounds 100A to 100F | S | S | H | H | p-$C_6H_{13}$—Ph—* | H | p-$C_6H_{13}$—Ph—* |
| Compounds 101A to 101F | S | S | H | H | p-$C_7H_{15}$—Ph—* | H | p-$C_7H_{15}$—Ph—* |
| Compounds 102A to 102F | S | S | H | H | p-$C_8H_{17}$—Ph—* | H | p-$C_8H_{17}$—Ph—* |

TABLE 2-continued

| | Xa | X | Z | $R_{11}$ | $R_{12}$ | $R_{21}$ | $R_{22}$ |
|---|---|---|---|---|---|---|---|
| Compounds 103A to 103F | S | S | H | H | p-$C_9H_{19}$—Ph—* | H | p-$C_9H_{19}$—Ph—* |
| Compounds 104A to 104F | S | S | H | H | p-$C_{10}H_{21}$—Ph—* | H | p-$C_{10}H_{21}$—Ph—* |
| Compounds 105A to 105F | S | S | H | H | p-$C_{11}H_{23}$—Ph—* | H | p-$C_{11}H_{23}$—Ph—* |
| Compounds 106A to 106F | S | S | H | H | p-$C_{12}H_{25}$—Ph—* | H | p-$C_{12}H_{25}$—Ph—* |
| Compounds 107A to 107F | S | S | H | H | p-$C_{13}H_{27}$—Ph—* | H | p-$C_{13}H_{27}$—Ph—* |
| Compounds 108A to 108F | S | S | H | H | p-$C_{14}H_{29}$—Ph—* | H | p-$C_{14}H_{29}$—Ph—* |
| Compounds 109A to 109F | S | S | H | H | p-$C_{15}H_{31}$—Ph—* | H | p-$C_{15}H_{31}$—Ph—* |
| Compounds 110A to 110F | S | S | H | H | p-$C_{16}H_{33}$—Ph—* | H | p-$C_{16}H_{33}$—Ph—* |
| Compounds 111A to 111F | S | S | H | H | p-$C_{17}H_{35}$—Ph—* | H | p-$C_{17}H_{35}$—Ph—* |
| Compounds 112A to 112F | S | S | H | H | p-$C_{18}H_{37}$—Ph—* | H | p-$C_{18}H_{37}$—Ph—* |
| Compounds 113A to 113F | S | S | H | H | X1 | H | X1 |
| Compounds 114A to 114F | S | S | H | H | X2 | H | X2 |
| Compounds 115A to 115F | S | S | H | H | X3 | H | X3 |
| Compounds 116A to 116F | S | S | H | H | X4 | H | X4 |
| Compounds 117A to 117F | S | S | H | H | X5 | H | X5 |
| Compounds 118A to 118F | S | S | H | H | X6 | H | X6 |
| Compounds 119A to 119F | S | S | H | H | X7 | H | X7 |
| Compounds 120A to 120F | S | S | H | H | X8 | H | X8 |
| Compounds 121A to 121F | S | S | H | H | X9 | H | X9 |
| Compounds 122A to 122F | S | S | H | H | X10 | H | X10 |
| Compounds 123A to 123F | S | S | H | H | X11 | H | X11 |
| Compounds 124A to 124F | S | S | H | H | X12 | H | X12 |
| Compounds 125A to 125F | S | S | H | H | X13 | H | X13 |
| Compounds 126A to 126F | S | S | H | H | X14 | H | X14 |
| Compounds 127A to 127F | S | S | H | H | H | $C_5H_{11}$—* | H |
| Compounds 128A to 128F | S | S | H | H | H | $C_6H_{13}$—* | H |
| Compounds 129A to 129F | S | S | H | H | H | $C_7H_{15}$—* | H |
| Compounds 130A to 130F | S | S | H | H | H | $C_8H_{17}$—* | H |
| Compounds 131A to 131F | S | S | H | H | H | $C_9H_{19}$—* | H |
| Compounds 132A to 132F | S | S | H | H | H | $C_{10}H_{21}$—* | H |
| Compounds 133A to 133F | S | S | H | H | H | $C_{11}H_{23}$—* | H |
| Compounds 134A to 134F | S | S | H | H | H | $C_{12}H_{25}$—* | H |
| Compounds 135A to 135F | S | S | H | H | H | $C_{13}H_{27}$—* | H |
| Compounds 136A to 136F | S | S | H | H | H | $C_{14}H_{29}$—* | H |
| Compounds 137A to 137F | S | S | H | H | H | $C_{15}H_{31}$—* | H |
| Compounds 138A to 138F | S | S | H | H | H | $C_{16}H_{33}$—* | H |
| Compounds 139A to 139F | S | S | H | H | H | $C_{17}H_{35}$—* | H |
| Compounds 140A to 140F | S | S | H | H | H | $C_{18}H_{37}$—* | H |
| Compounds 141A to 141F | S | S | H | H | H | H | $C_5H_{11}$—* |
| Compounds 142A to 142F | S | S | H | H | H | H | $C_6H_{13}$—* |
| Compounds 143A to 143F | S | S | H | H | H | H | $C_7H_{15}$—* |
| Compounds 144A to 144F | S | S | H | H | H | H | $C_8H_{17}$—* |
| Compounds 145A to 145F | S | S | H | H | H | H | $C_9H_{19}$—* |
| Compounds 146A to 146F | S | S | H | H | H | H | $C_{10}H_{21}$—* |
| Compounds 147A to 147F | S | S | H | H | H | H | $C_{11}H_{23}$—* |
| Compounds 148A to 148F | S | S | H | H | H | H | $C_{12}H_{25}$—* |
| Compounds 149A to 149F | S | S | H | H | H | H | $C_{13}H_{27}$—* |
| Compounds 150A to 150F | S | S | H | H | H | H | $C_{14}H_{29}$—* |
| Compounds 151A to 151F | S | S | H | H | H | H | $C_{15}H_{31}$—* |
| Compounds 152A to 152F | S | S | H | H | H | H | $C_{16}H_{33}$—* |
| Compounds 153A to 153F | S | S | H | H | H | H | $C_{17}H_{35}$—* |
| Compounds 154A to 154F | S | S | H | H | H | H | $C_{18}H_{37}$—* |
| Compounds 155A to 155F | S | S | H | H | H | p-$C_5H_{11}$—Ph—* | H |
| Compounds 156A to 156F | S | S | H | H | H | p-$C_6H_{13}$—Ph—* | H |
| Compounds 157A to 157F | S | S | H | H | H | p-$C_7H_{15}$—Ph—* | H |
| Compounds 158A to 158F | S | S | H | H | H | p-$C_8H_{17}$—Ph—* | H |
| Compounds 159A to 159F | S | S | H | H | H | p-$C_9H_{19}$—Ph—* | H |
| Compounds 160A to 160F | S | S | H | H | H | p-$C_{10}H_{21}$—Ph—* | H |
| Compounds 161A to 161F | S | S | H | H | H | p-$C_{11}H_{23}$—Ph—* | H |
| Compounds 162A to 162F | S | S | H | H | H | p-$C_{12}H_{25}$—Ph—* | H |
| Compounds 163A to 163F | S | S | H | H | H | p-$C_{13}H_{27}$—Ph—* | H |
| Compounds 164A to 164F | S | S | H | H | H | p-$C_{14}H_{29}$—Ph—* | H |
| Compounds 165A to 165F | S | S | H | H | H | p-$C_{15}H_{31}$—Ph—* | H |
| Compounds 166A to 166F | S | S | H | H | H | p-$C_{16}H_{33}$—Ph—* | H |
| Compounds 167A to 167F | S | S | H | H | H | p-$C_{17}H_{35}$—Ph—* | H |
| Compounds 168A to 168F | S | S | H | H | H | p-$C_{16}H_{37}$—Ph—* | H |

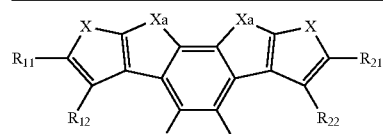

(A)

TABLE 2-continued

| | Xa | X | Z | R11 | R12 | R21 | R22 |
|---|---|---|---|---|---|---|---|

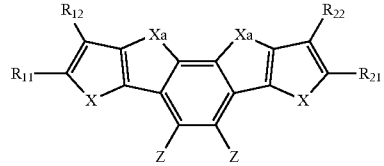

(B)

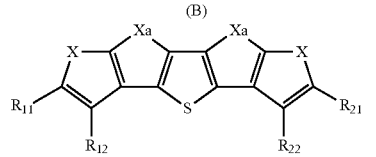

(C)

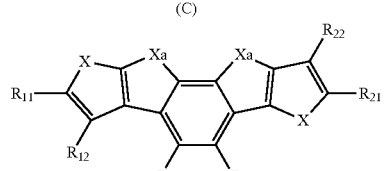

(D)

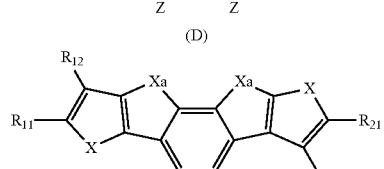

(E)

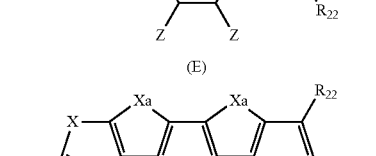

(F)

TABLE 3

| | Xa | X | Z | R11 | R12 | R21 | R22 |
|---|---|---|---|---|---|---|---|
| Compounds 169A to 169F | S | S | H | H | H | H | p-$C_5H_{11}$—Ph—* |
| Compounds 170A to 170F | S | S | H | H | H | H | p-$C_6H_{13}$—Ph—* |
| Compounds 171A to 171F | S | S | H | H | H | H | p-$C_7H_{15}$—Ph—* |
| Compounds 172A to 172F | S | S | H | H | H | H | p-$C_8H_{17}$—Ph—* |
| Compounds 173A to 173F | S | S | H | H | H | H | p-$C_9H_{19}$—Ph—* |
| Compounds 174A to 174F | S | S | H | H | H | H | p-$C_{10}H_{21}$—Ph—* |
| Compounds 175A to 175F | S | S | H | H | H | H | p-$C_{11}H_{23}$—Ph—* |
| Compounds 176A to 176F | S | S | H | H | H | H | p-$C_{12}H_{25}$—Ph—* |
| Compounds 177A to 177F | S | S | H | H | H | H | p-$C_{13}H_{27}$—Ph—* |
| Compounds 178A to 178F | S | S | H | H | H | H | p-$C_{14}H_{29}$—Ph—* |
| Compounds 179A to 179F | S | S | H | H | H | H | p-$C_{15}H_{31}$—Ph—* |
| Compounds 180A to 180F | S | S | H | H | H | H | p-$C_{16}H_{33}$—Ph—* |
| Compounds 181A to 181F | S | S | H | H | H | H | p-$C_{17}H_{35}$—Ph—* |
| Compounds 182A to 182F | S | S | H | H | H | H | p-$C_{18}H_{37}$—Ph—* |
| Compounds 183A to 183F | S | S | H | H | H | X1 | H |
| Compounds 184A to 184F | S | S | H | H | H | X2 | H |
| Compounds 185A to 185F | S | S | H | H | H | X3 | H |
| Compounds 186A to 186F | S | S | H | H | H | X4 | H |
| Compounds 187A to 187F | S | S | H | H | H | X5 | H |
| Compounds 188A to 188F | S | S | H | H | H | X6 | H |
| Compounds 189A to 189F | S | S | H | H | H | X7 | H |
| Compounds 190A to 190F | S | S | H | H | H | X8 | H |
| Compounds 191A to 191F | S | S | H | H | H | X9 | H |
| Compounds 192A to 192F | S | S | H | H | H | X10 | H |
| Compounds 193A to 193F | S | S | H | H | H | X11 | H |

TABLE 3-continued

|  | Xa | X | Z | $R_{11}$ | $R_{12}$ | $R_{21}$ | $R_{22}$ |
|---|---|---|---|---|---|---|---|
| Compounds 194A to 194F | S | S | H | H | H | X12 | H |
| Compounds 195A to 195F | S | S | H | H | H | X13 | H |
| Compounds 196A to 196F | S | S | H | H | H | H | X1 |
| Compounds 197A to 197F | S | S | H | H | H | H | X2 |
| Compounds 198A to 198F | S | S | H | H | H | H | X3 |
| Compounds 199A to 199F | S | S | H | H | H | H | X4 |
| Compounds 200A to 200F | S | S | H | H | H | H | X5 |
| Compounds 201A to 201F | S | S | H | H | H | H | X6 |
| Compounds 202A to 202F | S | S | H | H | H | H | X7 |
| Compounds 203A to 203F | S | S | H | H | H | H | X8 |
| Compounds 204A to 204F | S | S | H | H | H | H | X9 |
| Compounds 205A to 205F | S | S | H | H | H | H | X10 |
| Compounds 206A to 206F | S | S | H | H | H | H | X11 |
| Compounds 207A to 207F | S | S | H | H | H | H | X12 |
| Compounds 208A to 208F | S | S | H | H | H | H | X13 |

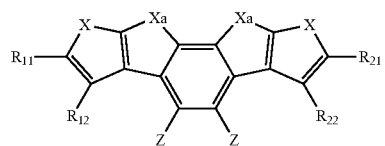

(A)

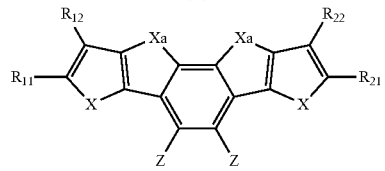

(B)

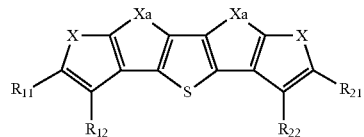

(C)

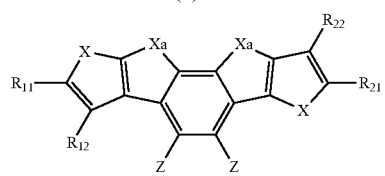

(D)

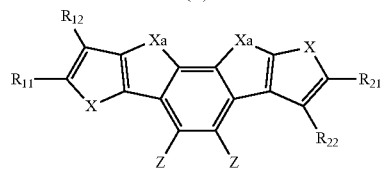

(E)

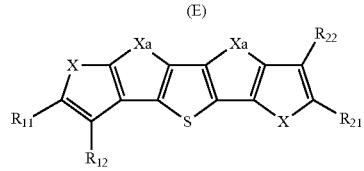

(F)

TABLE 4

|  | Xa | X | Z | $R_{11}$ | $R_{12}$ | $R_{21}$ | $R_{22}$ |
|---|---|---|---|---|---|---|---|
| Compounds 209A to 209F | S | S | H | $C_{12}H_{25}$—* | H | p-$C_5H_{11}$—Ph—* | H |
| Compounds 210A to 210F | S | S | H | $C_{12}H_{25}$—* | H | p-$C_6H_{13}$—Ph—* | H |

TABLE 4-continued

|  | Xa | X | Z | $R_{11}$ | $R_{12}$ | $R_{21}$ | $R_{22}$ |
|---|---|---|---|---|---|---|---|
| Compounds 211A to 211F | S | S | H | $C_{12}H_{25}$—* | H | p-$C_7H_{15}$—Ph—* | H |
| Compounds 212A to 212F | S | S | H | $C_{12}H_{25}$—* | H | p-$C_8H_{17}$—Ph—* | H |
| Compounds 213A to 213F | S | S | H | $C_{12}H_{25}$—* | H | p-$C_9H_{19}$—Ph—* | H |
| Compounds 214A to 214F | S | S | H | $C_{12}H_{25}$—* | H | p-$C_{10}H_{21}$—Ph—* | H |
| Compounds 215A to 215F | S | S | H | $C_{12}H_{25}$—* | H | p-$C_{11}H_{23}$—Ph—* | H |
| Compounds 216A to 216F | S | S | H | $C_{12}H_{25}$—* | H | p-$C_{12}H_{25}$—Ph—* | H |
| Compounds 217A to 217F | S | S | H | $C_{12}H_{25}$—* | H | p-$C_{13}H_{27}$—Ph—* | H |
| Compounds 218A to 218F | S | S | H | $C_{12}H_{25}$—* | H | p-$C_{14}H_{29}$—Ph—* | H |
| Compounds 219A to 219F | S | S | H | $C_{12}H_{25}$—* | H | p-$C_{15}H_{31}$—Ph—* | H |
| Compounds 220A to 220F | S | S | H | $C_{12}H_{25}$—* | H | p-$C_{16}H_{33}$—Ph—* | H |
| Compounds 221A to 221F | S | S | H | $C_{12}H_{25}$—* | H | p-$C_{17}H_{35}$—Ph—* | H |
| Compounds 222A to 222F | S | S | H | $C_{12}H_{25}$—* | H | p-$C_{18}H_{37}$—Ph—* | H |
| Compounds 223A to 223F | S | S | H | $C_{12}H_{25}$—* | H | X1 | H |
| Compounds 224A to 224F | S | S | H | $C_{12}H_{25}$—* | H | X2 | H |
| Compounds 225A to 225F | S | S | H | $C_{12}H_{25}$—* | H | X3 | H |
| Compounds 226A to 226F | S | S | H | $C_{12}H_{25}$—* | H | X4 | H |
| Compounds 227A to 227F | S | S | H | $C_{12}H_{25}$—* | H | X5 | H |
| Compounds 228A to 228F | S | S | H | $C_{12}H_{25}$—* | H | X6 | H |
| Compounds 229A to 229F | S | S | H | $C_{12}H_{25}$—* | H | X7 | H |
| Compounds 230A to 230F | S | S | H | $C_{12}H_{25}$—* | H | X8 | H |
| Compounds 231A to 231F | S | S | H | $C_{12}H_{25}$—* | H | X9 | H |
| Compounds 232A to 232F | S | S | H | $C_{12}H_{25}$—* | H | X10 | H |
| Compounds 233A to 233F | S | S | H | $C_{12}H_{25}$—* | H | X11 | H |
| Compounds 234A to 234F | S | S | H | $C_{12}H_{25}$—* | H | X12 | H |
| Compounds 235A to 235F | S | S | H | $C_{12}H_{25}$—* | H | X13 | H |
| Compounds 236A to 236F | S | S | H | $C_{12}H_{25}$—* | H | X14 | H |
| Compounds 237A to 237F | S | S | H | $C_{12}H_{25}$—* | H | H | $C_5H_{11}$—* |
| Compounds 238A to 238F | S | S | H | $C_{12}H_{25}$—* | H | H | $C_6H_{13}$—* |
| Compounds 239A to 239F | S | S | H | $C_{12}H_{25}$—* | H | H | $C_7H_{15}$—* |
| Compounds 240A to 240F | S | S | H | $C_{12}H_{25}$—* | H | H | $C_8H_{17}$—* |
| Compounds 241A to 241F | S | S | H | $C_{12}H_{25}$—* | H | H | $C_9H_{19}$—* |
| Compounds 242A to 242F | S | S | H | $C_{12}H_{25}$—* | H | H | $C_{10}H_{21}$—* |
| Compounds 243A to 243F | S | S | H | $C_{12}H_{25}$—* | H | H | $C_{11}H_{23}$—* |
| Compounds 244A to 244F | S | S | H | $C_{12}H_{25}$—* | H | H | $C_{12}H_{25}$—* |
| Compounds 245A to 245F | S | S | H | $C_{12}H_{25}$—* | H | H | $C_{13}H_{27}$—* |
| Compounds 246A to 246F | S | S | H | $C_{12}H_{25}$—* | H | H | $C_{14}H_{29}$—* |
| Compounds 247A to 247F | S | S | H | $C_{12}H_{25}$—* | H | H | $C_{15}H_{31}$—* |
| Compounds 248A to 248F | S | S | H | $C_{12}H_{25}$—* | H | H | $C_{16}H_{33}$—* |
| Compounds 249A to 249F | S | S | H | $C_{12}H_{25}$—* | H | H | $C_{17}H_{35}$—* |
| Compounds 250A to 250F | S | S | H | $C_{12}H_{25}$—* | H | H | $C_{18}H_{37}$—* |
| Compounds 251A to 251F | S | S | H | $C_{12}H_{25}$—* | H | H | p-$C_5H_{11}$—Ph—* |
| Compounds 252A to 252F | S | S | H | $C_{12}H_{25}$—* | H | H | p-$C_6H_{13}$—Ph—* |
| Compounds 253A to 253F | S | S | H | $C_{12}H_{25}$—* | H | H | p-$C_7H_{15}$—Ph—* |
| Compounds 254A to 254F | S | S | H | $C_{12}H_{25}$—* | H | H | p-$C_8H_{17}$—Ph—* |
| Compounds 255A to 255F | S | S | H | $C_{12}H_{25}$—* | H | H | p-$C_9H_{19}$—Ph—* |
| Compounds 256A to 256F | S | S | H | $C_{12}H_{25}$—* | H | H | p-$C_{10}H_{21}$—Ph—* |
| Compounds 257A to 257F | S | S | H | $C_{12}H_{25}$—* | H | H | p-$C_{11}H_{23}$—Ph—* |
| Compounds 258A to 258F | S | S | H | $C_{12}H_{25}$—* | H | H | p-$C_{12}H_{25}$—Ph—* |
| Compounds 259A to 259F | S | S | H | $C_{12}H_{25}$—* | H | H | p-$C_{13}H_{27}$—Ph—* |
| Compounds 260A to 260F | S | S | H | $C_{12}H_{25}$—* | H | H | p-$C_{14}H_{29}$—Ph—* |
| Compounds 261A to 261F | S | S | H | $C_{12}H_{25}$—* | H | H | p-$C_{15}H_{31}$—Ph—* |
| Compounds 262A to 262F | S | S | H | $C_{12}H_{25}$—* | H | H | p-$C_{16}H_{33}$—Ph—* |
| Compounds 263A to 263F | S | S | H | $C_{12}H_{25}$—* | H | H | p-$C_{17}H_{35}$—Ph—* |
| Compounds 264A to 264F | S | S | H | $C_{12}H_{25}$—* | H | H | p-$C_{18}H_{37}$—Ph—* |
| Compounds 265A to 265F | S | S | H | H | $C_{12}H_{25}$—* | H | p-$C_5H_{11}$—Ph—* |
| Compounds 266A to 266F | S | S | H | H | $C_{12}H_{25}$—* | H | p-$C_6H_{13}$—Ph—* |
| Compounds 267A to 267F | S | S | H | H | $C_{12}H_{25}$—* | H | p-$C_7H_{15}$—Ph—* |
| Compounds 268A to 268F | S | S | H | H | $C_{12}H_{25}$—* | H | p-$C_8H_{17}$—Ph—* |
| Compounds 269A to 269F | S | S | H | H | $C_{12}H_{25}$—* | H | p-$C_9H_{19}$—Ph—* |
| Compounds 270A to 270F | S | S | H | H | $C_{12}H_{25}$—* | H | p-$C_{10}H_{21}$—Ph—* |
| Compounds 271A to 271F | S | S | H | H | $C_{12}H_{25}$—* | H | p-$C_{11}H_{23}$—Ph—* |
| Compounds 272A to 272F | S | S | H | H | $C_{12}H_{25}$—* | H | p-$C_{12}H_{25}$—Ph—* |
| Compounds 273A to 273F | S | S | H | H | $C_{12}H_{25}$—* | H | p-$C_{13}H_{27}$—Ph—* |
| Compounds 274A to 274F | S | S | H | H | $C_{12}H_{25}$—* | H | p-$C_{14}H_{29}$—Ph—* |
| Compounds 275A to 275F | S | S | H | H | $C_{12}H_{25}$—* | H | p-$C_{15}H_{31}$—Ph—* |
| Compounds 276A to 276F | S | S | H | H | $C_{12}H_{25}$—* | H | p-$C_{16}H_{33}$—Ph—* |
| Compounds 277A to 277F | S | S | H | H | $C_{12}H_{25}$—* | H | p-$C_{17}H_{35}$—Ph—* |
| Compounds 278A to 278F | S | S | H | H | $C_{12}H_{25}$—* | H | p-$C_{18}H_{37}$—Ph—* |

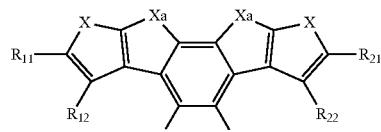

(A)

TABLE 4-continued

| | Xa | X | Z | R₁₁ | R₁₂ | R₂₁ | R₂₂ |
|---|---|---|---|---|---|---|---|

(B) [structure]

(C) [structure]

(D) [structure]

(E) [structure]

(F) [structure]

TABLE 5

| | Xa | X | Z | R₁₁ | R₁₂ | R₂₁ | R₂₂ |
|---|---|---|---|---|---|---|---|
| Compounds 279A to 279F | S | S | H | C₅H₁₁-pyridinyl-* | H | C₅H₁₁-pyridinyl-* | H |
| Compounds 280A to 280F | S | S | H | C₆H₁₃-pyridinyl-* | H | C₆H₁₃-pyridinyl-* | H |
| Compounds 281A to 281F | S | S | H | C₇H₁₅-pyridinyl-* | H | C₇H₁₅-pyridinyl-* | H |
| Compounds 282A to 282F | S | S | H | C₈H₁₇-pyridinyl-* | H | C₈H₁₇-pyridinyl-* | H |
| Compounds 283A to 283F | S | S | H | C₉H₁₉-pyridinyl-* | H | C₉H₁₉-pyridinyl-* | H |

| | Xa | X | Z | R₁₁ | R₁₂ | R₂₁ | R₂₂ |
|---|---|---|---|---|---|---|---|
| Compounds 284A to 284F | S | S | H | C₁₀H₂₁-pyridyl-* | H | C₁₀H₂₁-pyridyl-* | H |
| Compounds 285A to 285F | S | S | H | C₁₁H₂₃-pyridyl-* | H | C₁₁H₂₃-pyridyl-* | H |
| Compounds 286A to 286F | S | S | H | C₁₂H₂₅-pyridyl-* | H | C₁₂H₂₅-pyridyl-* | H |
| Compounds 287A to 287F | S | S | H | C₁₃H₂₇-pyridyl-* | H | C₁₃H₂₇-pyridyl-* | H |
| Compounds 288A to 288F | S | S | H | C₁₄H₂₉-pyridyl-* | H | C₁₄H₂₉-pyridyl-* | H |
| Compounds 289A to 289F | S | S | H | C₁₅H₃₁-pyridyl-* | H | C₁₅H₃₁-pyridyl-* | H |
| Compounds 290A to 290F | S | S | H | C₁₆H₃₃-pyridyl-* | H | C₁₆H₃₃-pyridyl-* | H |
| Compounds 291A to 291F | S | S | H | C₁₇H₃₅-pyridyl-* | H | C₁₇H₃₅-pyridyl-* | H |
| Compounds 292A to 292F | S | S | H | C₁₈H₃₇-pyridyl-* | H | C₁₈H₃₇-pyridyl-* | H |
| Compounds 293A to 293F | S | S | H | C₇H₁₅-CH=CH-* | H | C₇H₁₅-CH=CH-* | H |
| Compounds 294A to 294F | S | S | H | C₆H₁₃-CH=CH-* | H | C₆H₁₃-CH=CH-* | H |
| Compounds 295A to 295F | S | S | H | C₈H₁₇-CH=CH-* | H | C₈H₁₇-CH=CH-* | H |
| Compounds 296A to 296F | S | S | H | C₉H₁₉-CH=CH-* | H | C₉H₁₉-CH=CH-* | H |
| Compounds 297A to 297F | S | S | H | C₁₀H₂₁-CH=CH-* | H | C₁₀H₂₁-CH=CH-* | H |
| Compounds 298A to 298F | S | S | H | C₁₁H₂₃-CH=CH-* | H | C₁₁H₂₃-CH=CH-* | H |
| Compounds 299A to 299F | S | S | H | C₁₂H₂₅-CH=CH-* | H | C₁₂H₂₅-CH=CH-* | H |

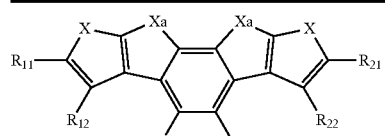

(A)

TABLE 5-continued

| | Xa | X | Z | R₁₁ | R₁₂ | R₂₁ | R₂₂ |
|---|---|---|---|---|---|---|---|

(B), (C), (D), (E), (F) structures shown.

TABLE 6

| | Xa | X | Z | $R_{11}$ | $R_{12}$ | $R_{21}$ | $R_{22}$ |
|---|---|---|---|---|---|---|---|
| Compounds 300A to 300F | S | S | H | $C_{13}H_{27}$–CH=CH–* | H | $C_{13}H_{27}$–CH=CH–* | H |
| Compounds 301A to 301F | S | S | H | $C_{14}H_{29}$–CH=CH–* | H | $C_{14}H_{29}$–CH=CH–* | H |
| Compounds 302A to 302F | S | S | H | $C_{15}H_{31}$–CH=CH–* | H | $C_{15}H_{31}$–CH=CH–* | H |
| Compounds 303A to 303F | S | S | H | $C_{16}H_{33}$–CH=CH–* | H | $C_{16}H_{33}$–CH=CH–* | H |
| Compounds 304A to 304F | S | S | H | $C_{17}H_{35}$–CH=CH–* | H | $C_{17}H_{35}$–CH=CH–* | H |
| Compounds 305A to 305F | S | S | H | $C_{18}H_{37}$–CH=CH–* | H | $C_{18}H_{37}$–CH=CH–* | H |
| Compounds 306A to 306F | S | S | H | $C_5H_{11}$–C≡C–* | H | $C_5H_{11}$–C≡C–* | H |

TABLE 6-continued

| | Xa | X | Z | R11 | R12 | R21 | R22 |
|---|---|---|---|---|---|---|---|
| Compounds 307A to 307F | S | S | H | C6H13—C≡C—* | H | C6H13—C≡C—* | H |
| Compounds 308A to 308F | S | S | H | C7H15—C≡C—* | H | C7H15—C≡C—* | H |
| Compounds 309A to 309F | S | S | H | C8H17—C≡C—* | H | C8H17—C≡C—* | H |
| Compounds 310A to 310F | S | S | H | C9H19—C≡C—* | H | C9H19—C≡C—* | H |
| Compounds 311A to 311F | S | S | H | C10H21—C≡C—* | H | C10H21—C≡C—* | H |
| Compounds 312A to 312F | S | S | H | C11H23—C≡C—* | H | C11H23—C≡C—* | H |
| Compounds 313A to 313F | S | S | H | C12H25—C≡C—* | H | C12H25—C≡C—* | H |
| Compounds 314A to 314F | S | S | H | C13H27—C≡C—* | H | C13H27—C≡C—* | H |
| Compounds 315A to 315F | S | S | H | C14H29—C≡C—* | H | C14H29—C≡C—* | H |
| Compounds 316A to 316F | S | S | H | C15H31—C≡C—* | H | C15H31—C≡C—* | H |
| Compounds 317A to 317F | S | S | H | C16H33—C≡C—* | H | C16H33—C≡C—* | H |
| Compounds 318A to 318F | S | S | H | C17H35—C≡C—* | H | C17H35—C≡C—* | H |
| Compounds 319A to 319F | S | S | H | C18H37—C≡C—* | H | C18H37—C≡C—* | H |

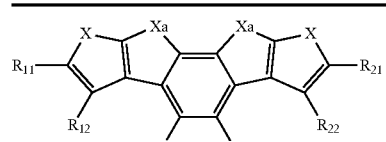

(A)

TABLE 6-continued

| | Xa | X | Z | R11 | R12 | R21 | R22 |
|---|---|---|---|---|---|---|---|

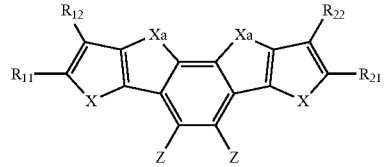

(B)

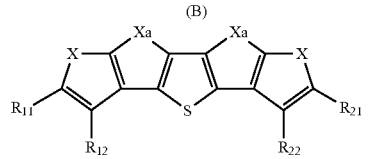

(C)

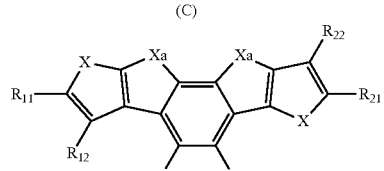

(D)

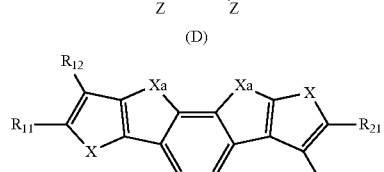

(E)

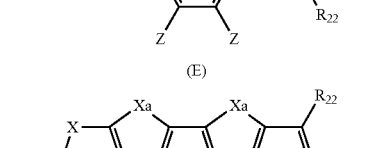

(F)

TABLE 7

| | Xa | X | Z | R11 | R12 | R21 | R22 |
|---|---|---|---|---|---|---|---|
| Compounds 320A to 320F | O | O | H | p-$C_5H_{11}$—* | H | p-$C_5H_{11}$—* | H |
| Compounds 321A to 321F | O | O | H | p-$C_6H_{13}$—* | H | p-$C_6H_{13}$—* | H |
| Compounds 322A to 322F | O | O | H | p-$C_7H_{15}$—* | H | p-$C_7H_{15}$—* | H |
| Compounds 323A to 323F | O | O | H | p-$C_8H_{17}$—* | H | p-$C_8H_{17}$—* | H |
| Compounds 324A to 324F | O | O | H | p-$C_9H_{19}$—* | H | p-$C_9H_{19}$—* | H |
| Compounds 325A to 325F | O | O | H | p-$C_{10}H_{21}$—* | H | p-$C_{10}H_{21}$—* | H |
| Compounds 326A to 326F | O | O | H | p-$C_{11}H_{23}$—* | H | p-$C_{11}H_{23}$—* | H |
| Compounds 327A to 327F | O | O | H | p-$C_{12}H_{25}$—* | H | p-$C_{12}H_{25}$—* | H |
| Compounds 328A to 328F | O | O | H | p-$C_{13}H_{27}$—* | H | p-$C_{13}H_{27}$—* | H |
| Compounds 329A to 329F | O | O | H | p-$C_{14}H_{29}$—* | H | p-$C_{14}H_{29}$—* | H |
| Compounds 330A to 330F | O | O | H | p-$C_{15}H_{31}$—* | H | p-$C_{15}H_{31}$—* | H |
| Compounds 331A to 331F | O | O | H | p-$C_{16}H_{33}$—* | H | p-$C_{16}H_{33}$—* | H |
| Compounds 332A to 332F | O | O | H | p-$C_{17}H_{35}$—* | H | p-$C_{17}H_{35}$—* | H |
| Compounds 333A to 333F | O | O | H | p-$C_{18}H_{37}$—* | H | p-$C_{18}H_{37}$—* | H |
| Compounds 334A to 334F | O | O | H | p-$C_5H_{11}$—Ph—* | H | p-$C_5H_{11}$—Ph—* | H |
| Compounds 335A to 335F | O | O | H | p-$C_6H_{13}$—Ph—* | H | p-$C_6H_{13}$—Ph—* | H |
| Compounds 336A to 336F | O | O | H | p-$C_7H_{15}$—Ph—* | H | p-$C_7H_{15}$—Ph—* | H |
| Compounds 337A to 337F | O | O | H | p-$C_8H_{17}$—Ph—* | H | p-$C_8H_{17}$—Ph—* | H |
| Compounds 338A to 338F | O | O | H | p-$C_9H_{19}$—Ph—* | H | p-$C_9H_{19}$—Ph—* | H |
| Compounds 339A to 339F | O | O | H | p-$C_{10}H_{21}$—Ph—* | H | p-$C_{10}H_{21}$—Ph—* | H |
| Compounds 340A to 340F | O | O | H | p-$C_{11}H_{23}$—Ph—* | H | p-$C_{11}H_{23}$—Ph—* | H |
| Compounds 341A to 341F | O | O | H | p-$C_{12}H_{25}$—Ph—* | H | p-$C_{12}H_{25}$—Ph—* | H |
| Compounds 342A to 342F | O | O | H | p-$C_{13}H_{27}$—Ph—* | H | p-$C_{13}H_{27}$—Ph—* | H |
| Compounds 343A to 343F | O | O | H | p-$C_{14}H_{29}$—Ph—* | H | p-$C_{14}H_{29}$—Ph—* | H |

TABLE 7-continued

|  | Xa | X | Z | R₁₁ | R₁₂ | R₂₁ | R₂₂ |
|---|---|---|---|---|---|---|---|
| Compounds 344A to 344F | O | O | H | p-C₁₅H₃₁—Ph—* | H | p-C₁₅H₃₁—Ph—* | H |
| Compounds 345A to 345F | O | O | H | p-C₁₆H₃₃—Ph—* | H | p-C₁₆H₃₃—Ph—* | H |
| Compounds 346A to 346F | O | O | H | p-C₁₇H₃₅—Ph—* | H | p-C₁₇H₃₅—Ph—* | H |
| Compounds 347A to 347F | O | O | H | p-C₁₈H₃₇—Ph—* | H | p-C₁₈H₃₇—Ph—* | H |
| Compounds 348A to 348F | O | O | H | X1 | H | X1 | H |
| Compounds 349A to 349F | O | O | H | X2 | H | X2 | H |
| Compounds 350A to 350F | O | O | H | X3 | H | X3 | H |
| Compounds 351A to 351F | O | O | H | X4 | H | X4 | H |
| Compounds 352A to 352F | O | O | H | X5 | H | X5 | H |
| Compounds 353A to 353F | O | O | H | X6 | H | X6 | H |
| Compounds 354A to 354F | O | O | H | X7 | H | X7 | H |
| Compounds 355A to 355F | O | O | H | X8 | H | X8 | H |
| Compounds 356A to 356F | O | O | H | X9 | H | X9 | H |
| Compounds 357A to 357F | O | O | H | X10 | H | X10 | H |
| Compounds 358A to 358F | O | O | H | X11 | H | X11 | H |
| Compounds 359A to 339F | O | O | H | X12 | H | X12 | H |
| Compounds 360A to 360F | O | O | H | X13 | H | X13 | H |
| Compounds 361A to 361F | O | O | H | X14 | H | X14 | H |
| Compounds 362A to 362F | S | S | H | C₄H₉OC₄H₈—* | H | C₄H₉OC₄H₈—* | H |
| Compounds 363A to 363F | S | S | H | C₂H₅OC₂H₄—* | H | C₂H₅OC₂H₄—* | H |
| Compounds 364A to 364F | S | S | H | C₆H₁₃OC₄H₈—* | H | C₆H₁₃OC₄H₈—* | H |
| Compounds 365A to 365F | S | S | H | C₂H₅OC₄H₈—* | H | C₂H₅OC₄H₈—* | H |
| Compounds 366A to 366F | S | S | H | CH₃OC₃H₆—* | H | CH₃OC₃H₆—* | H |
| Compounds 367A to 367F | S | S | H | PhC₃H₆—* | H | PhC₃H₆—* | H |
| Compounds 368A to 368F | S | S | H | PhOC₃H₆—* | H | PhOC₃H₆—* | H |

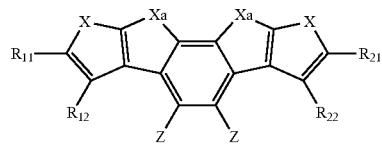

(A)

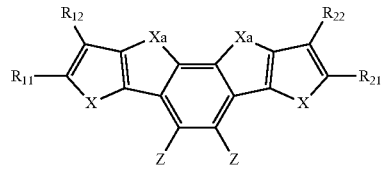

(B)

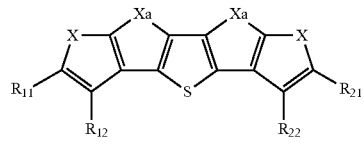

(C)

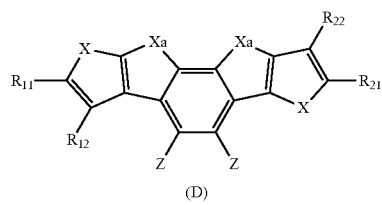

(D)

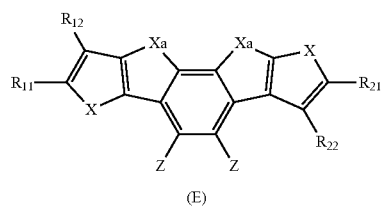

(E)

TABLE 7-continued

| | Xa | X | Z | R_{11} | R_{12} | R_{21} | R_{22} |
|---|---|---|---|---|---|---|---|

(F) [Structure showing fused ring system with Xa, X, S, R_{11}, R_{12}, R_{21}, R_{22}]

TABLE 8

| | Xa | X | Z | R_{11} | R_{12} | R_{21} | R_{22} |
|---|---|---|---|---|---|---|---|
| Compounds 369A to 369C | S | S | H | thiophene-(C_3H_6)—* | H | thiophene-(C_3H_6)—* | H |
| Compounds 370A to 370C | S | S | H | cyclohexyl-(C_2H_4)—* | H | cyclohexyl-(C_2H_4)—* | H |
| Compounds 371A to 371C | S | S | H | cyclohexyl-(C_3H_6)—* | H | cyclohexyl-(C_3H_6)—* | H |
| Compounds 372A to 372C | S | S | H | cyclopentyl-(C_3H_6)—* | H | cyclopentyl-(C_3H_6)—* | H |
| Compounds 373A to 373C | S | S | H | cyclobutyl-(C_3H_6)—* | H | cyclobutyl-(C_3H_6)—* | H |
| Compounds 374A to 374C | S | S | H | 3,7-Dimethyloctyl | H | C,.7-Dimethyloctyl | H |
| Compounds 375A to 375C | S | S | H | 3,7-Dimethyloctyl | H | H | H |
| Compounds 376A to 376C | S | S | H | 2-Ethylhexyl | H | 2-Ethylhexyl | H |
| Compounds 377A to 377C | S | S | H | (3,7-dimethyloctyl)phenyl—* | H | (3,7-dimethyloctyl)phenyl—* | H |
| Compounds 378A to 378C | S | S | H | C_5H_{11}-phenyl—* | H | (3,7-dimethyloctyl)phenyl—* | H |
| Compounds 379A to 379C | S | S | H | —Si(Me)_2—C≡C—* | H | —Si(Me)_2—C≡C—* | H |
| Compounds 380A to 380C | S | S | H | —Si(Me)_2—C≡C—* | H | H | H |
| Compounds 381A to 381C | S | S | H | —Si(Me)_2—O—Si(Me)_2—(CH_2)_6—* | H | —Si(Me)_2—O—Si(Me)_2—(CH_2)_6—* | H |
| Compounds 382A to 382C | S | S | H | C_6H_{11}—* | H | —Si(Me)_2—O—Si(Me)_2—(CH_2)_6—* | H |

TABLE 8-continued

| | Xa | X | Z | R₁₁ | R₁₂ | R₂₁ | R₂₂ |
|---|---|---|---|---|---|---|---|
| Compounds 383A to 383C | S | S | H | —Si—O—Si—(CH₂)₆—⟨phenyl⟩—* | H | —Si—O—Si—(CH₂)₆—⟨phenyl⟩—* | H |
| Compounds 384A to 384C | S | S | H | C₅H₁₁—⟨phenyl⟩—* | H | —Si—O—Si—(CH₂)₆—⟨phenyl⟩—* | H |
| Compounds 385A to 385C | S | S | H | C₈H₁₇—C≡C—⟨phenyl⟩—* | H | C₈H₁₇—C≡C—⟨phenyl⟩—* | H |
| Compounds 386A to 386C | S | S | H | C₈H₁₇—CH=CH—⟨phenyl⟩—* | H | C₈H₁₇—CH=CH—⟨phenyl⟩—* | H |
| Compounds 387A to 387C | S | S | H | CH₂=CH—(CH₂)₆—* | H | CH₂=CH—(CH₂)₆—* | H |
| Compounds 388A to 388C | S | S | H | CH₂=CH—(CH₂)₆—* | H | H | H |
| Compounds 389A to 389C | S | S | H | CH₃CH₂CH=CH—CH₂CH₂—* | H | CH₃CH₂CH=CH—CH₂CH₂—* | H |
| Compounds 390A to 390C | S | S | H | CH₃CH₂CH₂CH=CH—CH₂CH₂—* | H | CH₃CH₂CH₂CH=CH—CH₂CH₂—* | H |
| Compounds 391A to 391C | S | S | H | CH₂=CH—(CH₂)₆—⟨phenyl⟩—* | H | CH₂=CH—(CH₂)₆—⟨phenyl⟩—* | H |
| Compounds 392A to 392C | S | S | H | C₈H₁₇—⟨phenyl⟩—* | H | CH₂=CH—(CH₂)₆—⟨phenyl⟩—* | H |

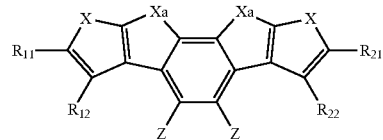

(A)

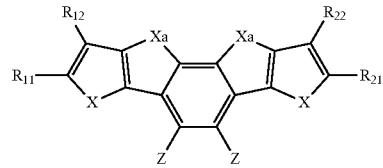

(B)

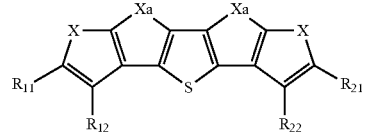

(C)

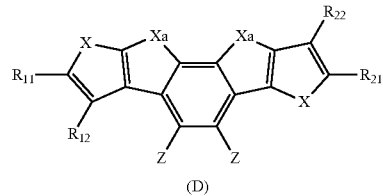

(D)

TABLE 8-continued

| | Xa | X | Z | R11 | R12 | R21 | R22 |
|---|---|---|---|---|---|---|---|

(E) [chemical structure]

(F) [chemical structure]

TABLE 9

| | Xa | X | Z | R11 | R12 | R21 | R22 |
|---|---|---|---|---|---|---|---|
| Compounds 393D to 393F | S | S | H | p-C$_5$H$_{11}$—* | H | H | H |
| Compounds 394D to 394F | S | S | H | p-C$_6$H$_{13}$—* | H | H | H |
| Compounds 395D to 395F | S | S | H | p-C$_7$H$_{15}$—* | H | H | H |
| Compounds 396D to 396F | S | S | H | p-C$_8$H$_{17}$—* | H | H | H |
| Compounds 397D to 397F | S | S | H | p-C$_9$H$_{19}$—* | H | H | H |
| Compounds 398D to 398F | S | S | H | p-C$_{10}$H$_{21}$—* | H | H | H |
| Compounds 399D to 399F | S | S | H | p-C$_{11}$H$_{23}$—* | H | H | H |
| Compounds 400D to 400F | S | S | H | p-C$_{12}$H$_{25}$—* | H | H | H |
| Compounds 401D to 401F | S | S | H | p-C$_{13}$H$_{27}$—* | H | H | H |
| Compounds 402D to 402F | S | S | H | p-C$_{14}$H$_{29}$—* | H | H | H |
| Compounds 403D to 403F | S | S | H | p-C$_{15}$H$_{31}$—* | H | H | H |
| Compounds 404D to 404F | S | S | H | p-C$_{16}$H$_{33}$—* | H | H | H |
| Compounds 405D to 405F | S | S | H | p-C$_{17}$H$_{35}$—* | H | H | H |
| Compounds 406D to 406F | S | S | H | p-C$_{18}$H$_{37}$—* | H | H | H |
| Compounds 407D to 407F | S | S | H | H | p-C$_5$H$_{11}$—* | H | H |
| Compounds 408D to 408F | S | S | H | H | p-C$_6$H$_{13}$—* | H | H |
| Compounds 409D to 409F | S | S | H | H | p-C$_7$H$_{15}$—* | H | H |
| Compounds 410D to 410F | S | S | H | H | p-C$_8$H$_{17}$—* | H | H |
| Compounds 411D to 411F | S | S | H | H | p-C$_9$H$_{19}$—* | H | H |
| Compounds 412D to 412F | S | S | H | H | p-C$_{10}$H$_{21}$—* | H | H |
| Compounds 413D to 413F | S | S | H | H | p-C$_{11}$H$_{23}$—* | H | H |
| Compounds 414D to 414F | S | S | H | H | p-C$_{12}$H$_{25}$—* | H | H |
| Compounds 415D to 415F | S | S | H | H | p-C$_{13}$H$_{27}$—* | H | H |
| Compounds 416D to 416F | S | S | H | H | p-C$_{14}$H$_{29}$—* | H | H |
| Compounds 417D to 417F | S | S | H | H | p-C$_{15}$H$_{31}$—* | H | H |
| Compounds 418D to 418F | S | S | H | H | p-C$_{16}$H$_{33}$—* | H | H |
| Compounds 419D to 419F | S | S | H | H | p-C$_{17}$H$_{35}$—* | H | H |
| Compounds 420D to 420F | S | S | H | H | p-C$_{18}$H$_{37}$—* | H | H |
| Compounds 421D to 421F | S | S | H | p-C$_5$H$_{11}$—Ph—* | H | H | H |
| Compounds 422D to 422F | S | S | H | p-C$_6$H$_{13}$—Ph—* | H | H | H |
| Compounds 423D to 423F | S | S | H | p-C$_7$H$_{15}$—Ph—* | H | H | H |
| Compounds 424D to 424F | S | S | H | p-C$_8$H$_{17}$—Ph—* | H | H | H |
| Compounds 425D to 425F | S | S | H | p-C$_9$H$_{19}$—Ph—* | H | H | H |
| Compounds 426D to 426F | S | S | H | p-C$_{10}$H$_{21}$—Ph—* | H | H | H |
| Compounds 427D to 427F | S | S | H | p-C$_{11}$H$_{23}$—Ph—* | H | H | H |
| Compounds 428D to 428F | S | S | H | p-C$_{12}$H$_{25}$—Ph—* | H | H | H |
| Compounds 429D to 429F | S | S | H | p-C$_{13}$H$_{27}$—Ph—* | H | H | H |
| Compounds 430D to 430F | S | S | H | p-C$_{14}$H$_{29}$—Ph—* | H | H | H |
| Compounds 431D to 431F | S | S | H | p-C$_{15}$H$_{31}$—Ph—* | H | H | H |
| Compounds 432D to 432F | S | S | H | p-C$_{16}$H$_{33}$—Ph—* | H | H | H |
| Compounds 433D to 433F | S | S | H | p-C$_{17}$H$_{35}$—Ph—* | H | H | H |
| Compounds 434D to 434F | S | S | H | p-C$_{18}$H$_{37}$—Ph—* | H | H | H |
| Compounds 435D to 435F | S | S | H | H | p-C$_5$H$_{11}$—Ph—* | H | H |
| Compounds 436D to 436F | S | S | H | H | p-C$_6$H$_{13}$—Ph—* | H | H |
| Compounds 437D to 437F | S | S | H | H | p-C$_7$H$_{15}$—Ph—* | H | H |
| Compounds 438D to 438F | S | S | H | H | p-C$_8$H$_{17}$—Ph—* | H | H |
| Compounds 439D to 439F | S | S | H | H | p-C$_9$H$_{19}$—Ph—* | H | H |
| Compounds 440D to 440F | S | S | H | H | p-C$_{10}$H$_{21}$—Ph—* | H | H |
| Compounds 441D to 441F | S | S | H | H | p-C$_{11}$H$_{23}$—Ph—* | H | H |
| Compounds 442D to 442F | S | S | H | H | p-C$_{12}$H$_{25}$—Ph—* | H | H |
| Compounds 443D to 443F | S | S | H | H | p-C$_{13}$H$_{27}$—Ph—* | H | H |
| Compounds 444D to 444F | S | S | H | H | p-C$_{14}$H$_{29}$—Ph—* | H | H |
| Compounds 445D to 445F | S | S | H | H | p-C$_{15}$H$_{31}$—Ph—* | H | H |

TABLE 9-continued

|  | Xa | X | Z | R11 | R12 | R21 | R22 |
|---|---|---|---|---|---|---|---|
| Compounds 446D to 446F | S | S | H | H | p-C16H33—Ph—* | H | H |
| Compounds 447D to 447F | S | S | H | H | p-C17H35—Ph—* | H | H |
| Compounds 448D to 448F | S | S | H | H | p-C18H37—Ph—* | H | H |
| Compounds 449D to 449F | S | S | H | X1 | H | H | H |
| Compounds 450D to 450F | S | S | H | X2 | H | H | H |
| Compounds 451D to 451F | S | S | H | X3 | H | H | H |
| Compounds 452D to 452F | S | S | H | X4 | H | H | H |
| Compounds 453D to 453F | S | S | H | X5 | H | H | H |
| Compounds 454D to 454F | S | S | H | X6 | H | H | H |
| Compounds 455D to 455F | S | S | H | X7 | H | H | H |
| Compounds 456D to 456F | S | S | H | X8 | H | H | H |
| Compounds 457D to 457F | S | S | H | X9 | H | H | H |
| Compounds 458D to 458F | S | S | H | X10 | H | H | H |
| Compounds 459D to 459F | S | S | H | X11 | H | H | H |
| Compounds 460D to 460F | S | S | H | X12 | H | H | H |
| Compounds 461D to 461F | S | S | H | X13 | H | H | H |
| Compounds 462D to 462F | S | S | H | X14 | H | H | H |
| Compounds 463D to 463F | S | S | H | H | X1 | H | H |
| Compounds 464D to 464F | S | S | H | H | X2 | H | H |
| Compounds 465D to 465F | S | S | H | H | X3 | H | H |
| Compounds 466D to 466F | S | S | H | H | X4 | H | H |
| Compounds 467D to 467F | S | S | H | H | X5 | H | H |
| Compounds 468D to 468F | S | S | H | H | X6 | H | H |
| Compounds 469D to 469F | S | S | H | H | X7 | H | H |
| Compounds 470D to 470F | S | S | H | H | X8 | H | H |
| Compounds 471D to 471F | S | S | H | H | X9 | H | H |
| Compounds 472D to 472F | S | S | H | H | X10 | H | H |
| Compounds 473D to 473F | S | S | H | H | X11 | H | H |
| Compounds 474D to 474F | S | S | H | H | X12 | H | H |
| Compounds 475D to 475F | S | S | H | H | X13 | H | H |
| Compounds 476D to 476F | S | S | H | H | X14 | H | H |

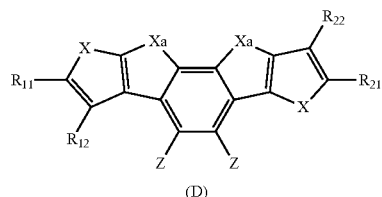

(D)

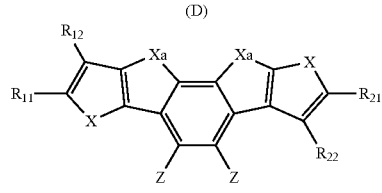

(E)

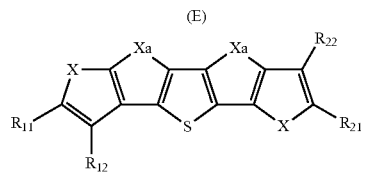

(F)

TABLE 10

|  | Xa | X | Z | R11 | R22 | R21 | R22 |
|---|---|---|---|---|---|---|---|
| Compounds 477D to 477F | S | S | H | p-C5H11—Ph—* | H | C12H25—* | H |
| Compounds 478D to 478F | S | S | H | p-C6H13—Ph—* | H | C12H25—* | H |
| Compounds 479D to 479F | S | S | H | p-C7H15—Ph—* | H | C12H25—* | H |
| Compounds 480D to 480F | S | S | H | p-C8H17—Ph—* | H | C12H25—* | H |
| Compounds 481D to 481F | S | S | H | p-C9H19—Ph—* | H | C12H25—* | H |
| Compounds 482D to 482F | S | S | H | p-C10H21—Ph—* | H | C12H25—* | H |
| Compounds 483D to 483F | S | S | H | p-C11H23—Ph—* | H | C12H25—* | H |
| Compounds 484D to 484F | S | S | H | p-C12H25—Ph—* | H | C12H25—* | H |
| Compounds 485D to 485F | S | S | H | p-C13H27—Ph—* | H | C12H25—* | H |
| Compounds 486D to 486F | S | S | H | p-C14H29—Ph—* | H | C12H25—* | H |

TABLE 10-continued

|  | Xa | X | Z | $R_{11}$ | $R_{22}$ | $R_{21}$ | $R_{22}$ |
|---|---|---|---|---|---|---|---|
| Compounds 487D to 487F | S | S | H | p-$C_{15}H_{31}$—Ph—* | H | $C_{12}H_{25}$—* | H |
| Compounds 488D to 488F | S | S | H | p-$C_{16}H_{33}$—Ph—* | H | $C_{12}H_{25}$—* | H |
| Compounds 489D to 489F | S | S | H | p-$C_{17}H_{35}$—Ph—* | H | $C_{12}H_{25}$—* | H |
| Compounds 490D to 490F | S | S | H | p-$C_{18}H_{37}$—Ph—* | H | $C_{12}H_{25}$—* | H |
| Compounds 491D to 491F | S | S | H | H | $C_{12}H_{25}$—* | $C_5H_{11}$—* | H |
| Compounds 492D to 492F | S | S | H | H | $C_{12}H_{25}$—* | $C_6H_{13}$—* | H |
| Compounds 493D to 493F | S | S | H | H | $C_{12}H_{25}$—* | $C_7H_{15}$—* | H |
| Compounds 494D to 494F | S | S | H | H | $C_{12}H_{25}$—* | $C_8H_{17}$—* | H |
| Compounds 495D to 495F | S | S | H | H | $C_{12}H_{25}$—* | $C_9H_{19}$—* | H |
| Compounds 496D to 496F | S | S | H | H | $C_{12}H_{25}$—* | $C_{10}H_{21}$—* | H |
| Compounds 497D to 497F | S | S | H | H | $C_{12}H_{25}$—* | $C_{11}H_{23}$—* | H |
| Compounds 498D to 498F | S | S | H | H | $C_{12}H_{25}$—* | $C_{12}H_{25}$—* | H |
| Compounds 499D to 499F | S | S | H | H | $C_{12}H_{25}$—* | $C_{13}H_{27}$—* | H |
| Compounds 500D to 500F | S | S | H | H | $C_{12}H_{25}$—* | $C_{14}H_{29}$—* | H |
| Compounds 501D to 501F | S | S | H | H | $C_{12}H_{25}$—* | $C_{15}H_{31}$—* | H |
| Compounds 502D to 502F | S | S | H | H | $C_{12}H_{25}$—* | $C_{16}H_{33}$—* | H |
| Compounds 503D to 503F | S | S | H | H | $C_{12}H_{25}$—* | $C_{17}H_{35}$—* | H |
| Compounds 504D to 504F | S | S | H | H | $C_{12}H_{25}$—* | $C_{18}H_{37}$—* | H |
| Compounds 505D to 505F | S | S | H | H | p-$C_5H_{11}$—Ph—* | $C_{12}H_{25}$—* | H |
| Compounds 506D to 506F | S | S | H | H | p-$C_6H_{13}$—Ph—* | $C_{12}H_{25}$—* | H |
| Compounds 507D to 507F | S | S | H | H | p-$C_7H_{15}$—Ph—* | $C_{12}H_{25}$—* | H |
| Compounds 508D to 508F | S | S | H | H | p-$C_8H_{17}$—Ph—* | $C_{12}H_{25}$—* | H |
| Compounds 509D to 509F | S | S | H | H | p-$C_9H_{19}$—Ph—* | $C_{12}H_{25}$—* | H |
| Compounds 510D to 510F | S | S | H | H | p-$C_{10}H_{21}$—Ph—* | $C_{12}H_{25}$—* | H |
| Compounds 511D to 511F | S | S | H | H | p-$C_{11}H_{23}$—Ph—* | $C_{12}H_{25}$—* | H |
| Compounds 512D to 512F | S | S | H | H | p-$C_{12}H_{25}$—Ph—* | $C_{12}H_{25}$—* | H |
| Compounds 513D to 513F | S | S | H | H | p-$C_{13}H_{27}$—Ph—* | $C_{12}H_{25}$—* | H |
| Compounds 514D to 514F | S | S | H | H | p-$C_{14}H_{29}$—Ph—* | $C_{12}H_{25}$—* | H |
| Compounds 515D to 515F | S | S | H | H | p-$C_{15}H_{31}$—Ph—* | $C_{12}H_{25}$—* | H |
| Compounds 516D to 516F | S | S | H | H | p-$C_{16}H_{33}$—Ph—* | $C_{12}H_{25}$—* | H |
| Compounds 517D to 517F | S | S | H | H | p-$C_{17}H_{35}$—Ph—* | $C_{12}H_{25}$—* | H |
| Compounds 518D to 518F | S | S | H | H | p-$C_{18}H_{37}$—Ph—* | $C_{12}H_{25}$—* | H |

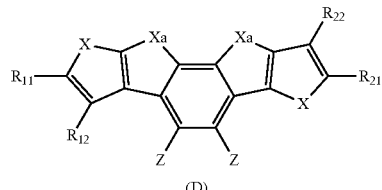

(D)

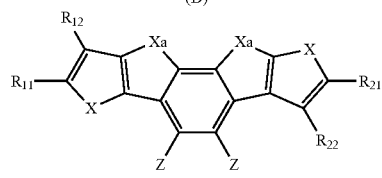

(E)

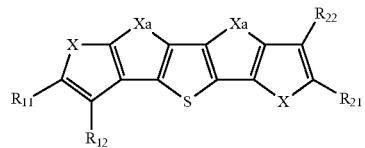

(F)

Abbreviations in the compounds are provided below.

Ph—: Phenyl group

—Ph—: Phenylene group

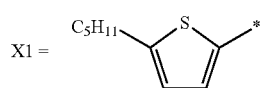

X1 =

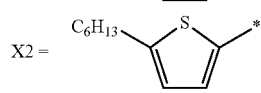

X2 =

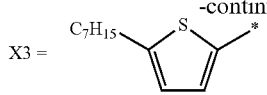

X3 =

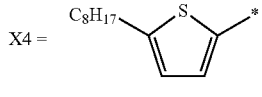

X4 =

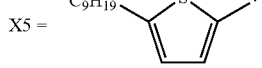

X5 =

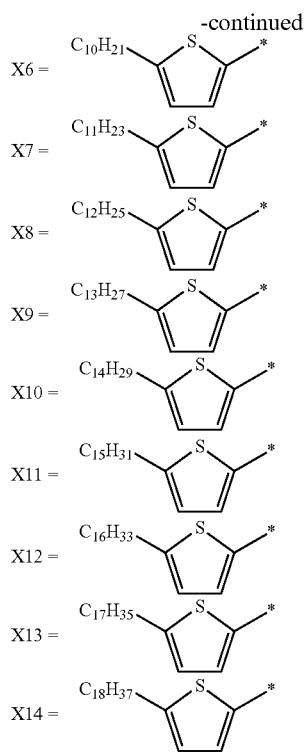

A method of synthesizing the compound represented by Formula 1 is not particularly limited and the compound represented by Formula 1 can be synthesized with reference to the well-known methods. Examples of the synthesization method include a method of introducing substituents ($R^1$ and $R^2$) by coupling reaction using a transition metal catalyst to a fused polycyclic aromatic ring compound.

The compound represented by Formula 1 may be used singly or two or more types thereof may be used in combination.

In the semiconductor active layer of the organic semiconductor element according to the present invention or an organic semiconductor film according to the present invention described below, a content of the compound represented by Formula 1 is preferably 30 to 100 mass %, more preferably 50 to 100 mass %, and even more preferably 70 to 100 mass %. In a case where a binder polymer described below is not contained, the total content is preferably 90 to 100 mass % and more preferably 95 to 100 mass %.

<Binder Polymer>

A semiconductor active layer of an organic semiconductor element according to the present invention preferably contains a binder polymer.

The organic semiconductor element according to the present invention may be an organic semiconductor element having the semiconductor active layer and a layer including a binder polymer.

The types of the binder polymer are not particularly limited, and well-known binder polymers can be used.

Examples of the binder polymer include a polystyrene resin, an acrylic resin, rubber, and a thermoplastic elastomer.

Among these, as the binder polymer, a polymer compound (a polymer having a monomer unit having a benzene ring group) having a benzene ring is preferable. The content of the monomer unit having a benzene ring group is not particularly limited. However, the content is preferably 50 mol % or greater, more preferably 70 mol % or greater, and even more preferably 90 mol % or greater with respect to the entire monomer unit. The upper limit is not particularly limited, but examples of the upper limit include 100 mol %.

Examples of the binder polymer include polystyrene, poly(α-methylstyrene), polyvinyl cinnamate, poly(4-vinylphenyl), and poly(4-methyl styrene).

A weight-average molecular weight of the binder polymer is not particularly limited, but is preferably 1,000 to 2,000,000, more preferably 3,000 to 1,000,000, and even more preferably 5,000 to 600,000.

In a case where a solvent described below is used, it is preferable that the binder polymer exhibits solubility higher than the solubility of the compound represented by Formula 1 in a used solvent. If the above aspect is adopted, mobility and heat resistance of the obtained organic semiconductor are further improved.

A content of the binder polymer in the semiconductor active layer of the organic semiconductor element of the present invention is preferably 1 to 200 parts by mass, more preferably 10 to 150 parts by mass, and even more preferably 20 to 120 parts by mass with respect to 100 parts by mass of the content of the compound represented by Formula 1. If the content is within the above range, mobility and heat resistance of the obtained organic semiconductor are further improved.

<Other Components>

Other components may be included other than the compound represented by Formula 1 and the binder polymer may be included in the semiconductor active layer according to the organic semiconductor element of the present invention.

As other components, known additives and the like can be used.

In the semiconductor active layer, a content of the components other than the compound represented by Formula 1 and the binder polymer is preferably 10 mass % or less, more preferably 5 mass % or less, even more preferably 1 mass % or less, and particularly preferably 0.1 mass % or less. If the content of other components is within the above range, film formability is improved, and mobility and heat resistance of the obtained organic semiconductor are further improved.

The method of forming the semiconductor active layer according to the organic semiconductor element of the present invention is not particularly limited. However, a desired semiconductor active layer can be formed by applying the organic semiconductor composition according to the present invention described below to a source electrode, a drain electrode, and a gate insulating film and performing a drying treatment, if necessary.

The organic semiconductor element of the present invention is preferably manufactured using the organic semiconductor composition of the present invention described below.

A method of manufacturing an organic semiconductor film or an organic semiconductor element by using the organic semiconductor composition of the present invention is not particularly limited, and known methods can be adopted. Examples thereof include a method of manufacturing an organic semiconductor film by applying the composition onto a predetermined base material and if necessary, performing a drying treatment.

The method of applying the composition onto a base material is not particularly limited, and known methods can be adopted. Examples thereof include an ink jet printing method, a screen printing method, a flexographic printing method, a bar coating method, a spin coating method, a knife coating method, a doctor blade method, and the like. Among these, an ink jet printing method, a screen printing method, and a flexographic printing method are preferable.

Preferred examples of the flexographic printing method include an aspect in which a photosensitive resin plate is used as a flexographic printing plate. By printing the composition onto a substrate according to the aspect, a pattern can be easily formed.

Among the above methods, the method of manufacturing an organic semiconductor element of the present invention preferably includes a coating step of coating a substrate with the organic semiconductor composition of the present invention described below. The method of manufacturing an organic semiconductor element of the present invention more preferably includes a coating step of coating a substrate with the organic semiconductor composition of the present invention and a removing step of removing at least a portion of the solvent from the coated organic semiconductor composition.

The organic semiconductor composition according to the present invention described below preferably includes a solvent and more preferably includes a solvent having a boiling point of 100° C. or higher.

As the solvent, well-known solvents can be used.

Specifically, examples thereof include a hydrocarbon-based solvent such as hexane, octane, decane, toluene, xylene, mesitylene, ethylbenzene, decalin, and 1-methylnaphthalene, a ketone-based solvent such as acetone, methyl ethyl ketone, methyl isobutyl ketone, or cyclohexanone, a halogenated hydrocarbon-based solvent such as dichloromethane, chloroform, tetrachloromethane, dichloroethane, trichloroethane, tetrachloroethane, chlorobenzene, dichlorobenzene, and chlorotoluene, an ester-based solvent such as ethyl acetate, butyl acetate, and amyl acetate, an alcohol-based solvent such as methanol, propanol, butanol, pentanol, hexanol, cyclohexanol, methyl cellosolve, ethyl cellosolve, and ethylene glycol, an ether-based solvent such as dibutyl ether, tetrahydrofuran, dioxane, and anisole, an amide-based solvent such as N,N-dimethylformamide and N,N-dimethylacetamide, an imide-based solvent such as 1-methyl-2-pyrrolidone and 1-methyl-2-imidazolidinone, a sulfoxide-based solvent such as dimethylsulfoxide, and a nitrile-based solvent such as acetonitrile.

In order to obtain stability of an organic semiconductor composition described below and to form an even film, a boiling point of the solvent in normal pressure is preferably 100° C. or higher, more preferably 150° C. or higher, even more preferably 175° C. or higher, and particularly preferably 200° C. or higher.

In order to dry the solvent, after the organic semiconductor composition is applied, the boiling point of the solvent in normal pressure is preferably 300° C. or lower, more preferably 250° C. or lower, and even more preferably 220° C. or lower.

Unless described otherwise, according to the present invention, the boiling point is a boiling point in normal pressure.

The solvent may be used singly or two or more types thereof may be used in combination.

Among these, a hydrocarbon-based solvent, a halogenated hydrocarbon-based solvent, and/or an ether-based solvent are preferable, and toluene, xylene, mesitylene, tetralin, dichlorobenzene and anisole are more preferable.

In a case where the solvent is contained, the content of the compound represented by in Formula 1 in the organic semiconductor composition of the present invention is preferably 20 mass % or less, more preferably 0.01 to 20 mass %, even more preferably 0.05 to 10 mass %, and particularly preferably 0.1 to 5 mass %. In a case where the binder polymer and the solvent are contained, the content of the binder polymer in the organic semiconductor composition according to the present invention is preferably 0.01 to 80 mass %, more preferably 0.05 to 10 mass %, and even more preferably 0.1 to 5 mass %. If the content is in the range described above, coating properties are excellent, and thus an organic semiconductor film can be easily formed.

The drying treatment in the removing step is a treatment performed if necessary, and the optimal treatment conditions are appropriately selected according to the type of the specific compound and the solvent used. In view of further improving mobility and heat resistance of the obtained organic semiconductor and improving productivity, a heating temperature is preferably 30° C. to 100° C. and more preferably 40° C. to 80° C., and a heating time is preferably 10 to 300 minutes and more preferably 30 to 180 minutes.

A thickness of the formed semiconductor active layer is not particularly limited. From the viewpoint of mobility and heat resistance of the obtained organic semiconductor, the film thickness is preferably 10 to 500 nm and more preferably 30 to 200 nm.

The organic semiconductor element is not particularly limited, but is preferably an organic semiconductor element having 2 to 5 terminals, and more preferably an organic semiconductor element having 2 or 3 terminals.

It is preferable that the organic semiconductor element is not a photoelectric conversion element.

The organic semiconductor element according to the present invention is preferably a non-luminous organic semiconductor element.

Examples of a 2-terminal element include a rectifier diode, a constant voltage diode, a PIN diode, a Schottky barrier diode, a surge protection diode, a diac, a varistor, a tunnel diode, and the like.

Examples of a 3-terminal element include a bipolar transistor, a Darlington transistor, a field effect transistor, insulated gate bipolar transistor, a uni-junction transistor, a static induction transistor, a gate turn-off thyristor, a triac, a static induction thyristor, and the like.

Among these, a rectifier diode and transistors are preferable, and a field effect transistor is more preferable.

As the field effect transistor, an organic thin film transistor is preferable.

An aspect of the organic thin film transistor of the present invention will be described with reference to drawings.

FIG. 1 is a schematic cross-sectional view of an aspect of an organic semiconductor element (organic thin film transistor (organic TFT)) of the present invention.

In FIG. 1, an organic thin film transistor 100 comprises a substrate 10, a gate electrode 20 disposed on the substrate 10, a gate insulating film 30 covering the gate electrode 20, a source electrode 40 and a drain electrode 42 which contact a surface of the gate insulating film 30 that is on the side opposite to the gate electrode 20 side, an organic semiconductor film 50 covering a surface of the gate insulating film 30 between the source electrode 40 and the drain electrode 42, and a sealing layer 60 covering each member. The organic thin film transistor 100 is a bottom gate-bottom contact type organic thin film transistor.

In FIG. 1, the organic semiconductor film 50 corresponds to a film formed of the composition described above.

Hereinafter, the substrate, the gate electrode, the gate insulating film, the source electrode, the drain electrode, the sealing layer, and methods for forming each of these will be specifically described.

<Substrate>

The substrate plays a role of supporting the gate electrode, the source electrode, the drain electrode, and the like which will be described later.

The type of the substrate is not particularly limited, and examples thereof include a plastic substrate, a glass substrate, a ceramic substrate, and the like. Among these, from the viewpoint of applicability to each device and costs, a glass substrate or a plastic substrate is preferable.

Examples of materials of the plastic substrate include a thermosetting resin (for example, an epoxy resin, a phenol resin, a polyimide resin, or a polyester resin (for example, polyethylene terephthalate (PET) or polyethylene naphthalate (PEN)) and a thermoplastic resin (for example, a phenoxy resin, a polyethersulfone, polysulfone, or polyphenylene sulfone).

Examples of materials of the ceramic substrate include alumina, aluminum nitride, zirconia, silicon, silicon nitride, silicon carbide, and the like.

Examples of materials of the glass substrate include soda lime glass, potash glass, borosilicate glass, quartz glass, aluminosilicate glass, lead glass, and the like.

<Gate Electrode, Source Electrode, and Drain Electrode>

Examples of materials of the gate electrode, the source electrode, and the drain electrode include a metal such as gold (Au), silver, aluminum (Al), copper, chromium, nickel, cobalt, titanium, platinum, tantalum, magnesium, calcium, barium, or sodium; a conductive oxide such as $InO_2$, $SnO_2$, or indium tin oxide (ITO); a conductive polymer such as polyaniline, polypyrrole, polythiophene, polyacetylene, or polydiacetylene; a semiconductor such as silicon, germanium, or gallium arsenide; a carbon material such as fullerene, carbon nanotubes, or graphite; and the like. Among these, a metal is preferable, and silver and aluminum are more preferable.

A thickness of each of the gate electrode, the source electrode, and the drain electrode is not particularly limited, but is preferably 20 to 200 nm.

A method of forming the gate electrode, the source electrode, and the drain electrode is not particularly limited, but examples thereof include a method of vacuum vapor-depositing or sputtering an electrode material onto a substrate, a method of coating a substrate with a composition for forming an electrode, a method of printing a composition for forming an electrode onto a substrate, and the like. Furthermore, in a case where the electrode is patterned, examples of the patterning method include a photolithography method; a printing method such as ink jet printing, screen printing, offset printing, or relief printing; a mask vapor deposition method; and the like.

<Gate Insulating Film>

Examples of materials of the gate insulating film include a polymer such as polymethyl methacrylate, polystyrene, polyvinylphenol, polyimide, polycarbonate, polyester, polyvinylalcohol, polyvinyl acetate, polyurethane, polysulfone, polybenzoxazole, polysilsesquioxane, an epoxy resin, or a phenol resin; an oxide such as silicon dioxide, aluminum oxide, or titanium oxide; a nitride such as silicon nitride; and the like. Among these materials, in view of the compatibility with the organic semiconductor film, a polymer is preferable.

In a case where a polymer is used as the material of the gate insulating film, it is preferable to use a cross-linking agent (for example, melamine) in combination. If the cross-linking agent is used in combination, the polymer is cross-linked, and durability of the formed gate insulating film is improved.

A film thickness of the gate insulating film is not particularly limited, but is preferably 100 to 1,000 nm.

A method of forming the gate insulating film is not particularly limited, but examples thereof include a method of coating a substrate, on which the gate electrode is formed, with a composition for forming a gate insulating film, a method of vapor-depositing or sputtering the material of the gate insulating film onto a substrate on which the gate electrode is formed, and the like. A method of coating the aforementioned substrate with the composition for forming a gate insulating film is not particularly limited, and it is possible to use a known method (a bar coating method, a spin coating method, a knife coating method, or a doctor blade method).

In a case where the gate insulating film is formed by coating the substrate with the composition for forming a gate insulating film, for the purpose of removing the solvent, causing cross-linking, or the like, the composition may be heated (baked) after coating.

<Binder Polymer Layer>

The organic semiconductor element of the present invention preferably has a layer of the aforementioned binder polymer between the semiconductor active layer and an insulating film, and more preferably has a layer of the aforementioned binder polymer between the semiconductor active layer and the gate insulating film. A film thickness of the binder polymer layer is not particularly limited, but is preferably 20 to 500 nm. The binder polymer layer should be a layer containing the aforementioned polymer, and is preferably a layer composed of the aforementioned binder polymer.

A method of forming the binder polymer layer is not particularly limited, and a known method (a bar coating method, a spin coating method, a knife coating method, a doctor blade method, or an ink jet method) can be used.

In a case where the binder polymer layer is formed by performing coating by using a composition for forming a binder polymer layer, for the purpose of removing a solvent, causing cross-linking, or the like, the composition may be heated (baked) after coating.

The binder polymer layer is preferably a binder polymer layer that can be formed together with a semiconductor active layer from the organic semiconductor composition according to the present invention.

<Sealing Layer>

From the viewpoint of durability, the organic semiconductor element of the present invention preferably comprises a sealing layer as an outermost layer. In the sealing layer, a known sealant can be used.

A thickness of the sealing layer is not particularly limited, but is preferably 0.2 to 10 μm.

A method of forming the sealing layer is not particularly limited, but examples thereof include a method of coating a substrate, on which the gate electrode, the gate insulating film, the source electrode, the drain electrode, and the organic semiconductor film are formed, with a composition for forming a sealing layer, and the like. Specific examples of the method of coating the substrate with the composition for forming a sealing layer are the same as the examples of the method of coating the substrate with the composition for forming a gate insulating film. In a case where the organic semiconductor film is formed by coating the substrate with the composition for forming a sealing layer, for the purpose of removing the solvent, causing cross-linking, or the like, the composition may be heated (baked) after coating.

Figure 2:
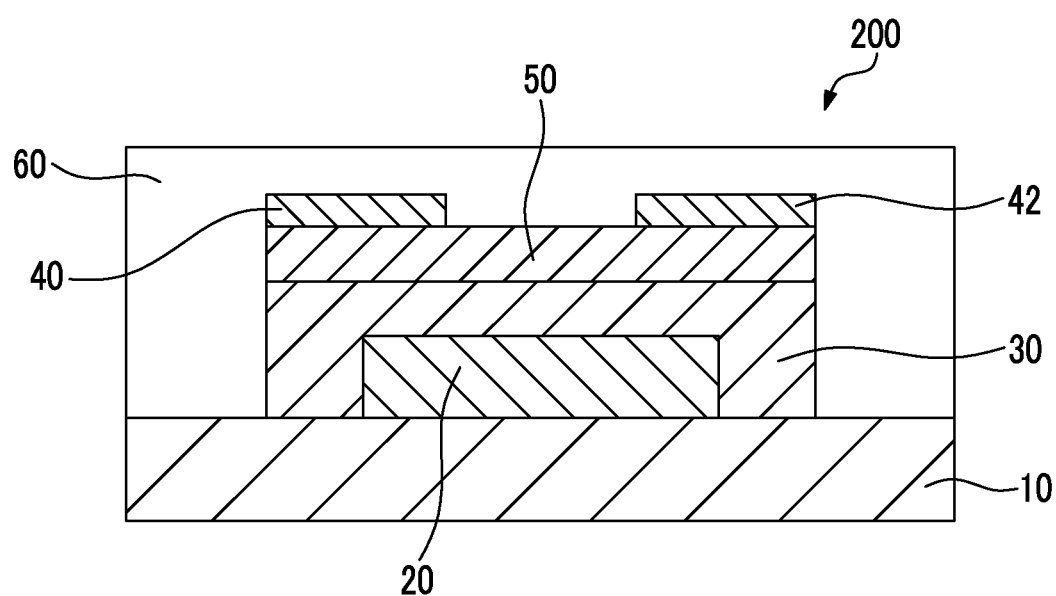
FIG. 2 is a schematic cross-sectional view of another aspect of the organic semiconductor element of the present invention.

FIG. 2 is a schematic cross-sectional view of another aspect of the organic semiconductor element (organic thin film transistor) of the present invention.

In FIG. 2, an organic thin film transistor 200 comprises the substrate 10, the gate electrode 20 disposed on the substrate 10, the gate insulating film 30 covering the gate electrode 20, the organic semiconductor film 50 disposed on the gate insulating film 30, the source electrode 40 and the drain electrode 42 disposed on the organic semiconductor film 50, and the sealing layer 60 covering each member. Herein, the source electrode 40 and the drain electrode 42 are formed using the aforementioned composition of the present invention. The organic thin film transistor 200 is a bottom gate-top contact type organic thin film transistor.

The substrate, the gate electrode, the gate insulating film, the source electrode, the drain electrode, the organic semiconductor film, and the sealing layer are as described above.

In FIGS. 1 and 2, the aspects of the bottom gate-bottom contact type organic thin film transistor and the bottom gate-top contact type organic thin film transistor were specifically described. However, the organic semiconductor element of the present invention can also suitably used in a top gate-bottom contact type organic thin film transistor and a top gate-top contact type organic thin film transistor.

The organic thin film transistor described above can be suitably used for electronic paper and a display device.

(Organic Semiconductor Composition)

The organic semiconductor composition according to the present invention is an organic semiconductor composition containing the compound represented by Formula 1 below and a solvent, the compound represented by Formula 1 below and the solvent having a boiling point of 100° C. or higher are contained, and a content of the compound represented by Formula 1 below is preferably 20 mass % or less with respect to a total amount of the organic semiconductor composition.

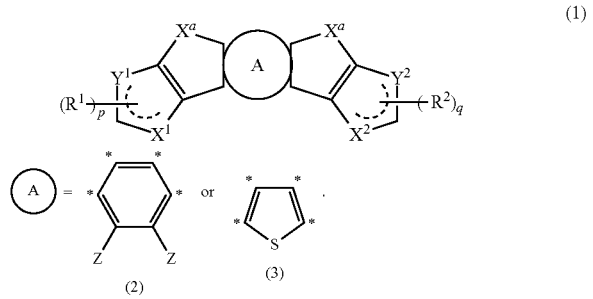

In Formula 1, A represents a central aromatic ring and is an aromatic ring selected from any one of aromatic rings represented by Formula 2 or 3, *'s represent bonding positions to two side chalcogenophene rings, and $X^a$'s represent chalcogen atoms, one of $X^1$ and $Y^1$ is a chalcogen atom and the other is $C(R^a)$, one of $X^2$ and $Y^2$ is a chalcogen atom and the other is $C(R^b)$, $R^a$'s each independently represent a hydrogen atom or $R^1$, $R^b$'s each independently represent a hydrogen atom or $R^2$, in a case where A is an aromatic ring represented by Formula 3, $Y^1$ and $Y^2$ each independently are a chalcogen atom, $X^1$ is $C(R^a)$, and $X^2$ is $C(R^b)$, p and q each independently represent an integer of 0 to 2, Z's each independently represent a hydrogen atom or a halogen atom, and $R^1$ and $R^2$ each independently represent a halogen atom or a group represented by Formula W below.

In Formula W, S represents a single bond or —$(C(R^S)_2)_n$—, $R^S$'s each independently represent a hydrogen atom or a halogen atom, n represents an integer of 1 to 17, L represents a single bond, a divalent linking group represented by any one of Formulae L-1 to L-15 below, or a divalent linking group obtained by bonding two or more divalent linking groups represented by any one of Formulae L-1 to L-15 below, and T represents an alkyl group, a haloalkyl group, a cyano group, a vinyl group, an ethynyl group, an aryl group, a heteroaryl group, an oxyethylene group, an oligooxyethylene group in which a repetition number of oxyethylene units is 2 or greater, a siloxane group, an oligosiloxane group having two or more silicon atoms, or a trialkylsilyl group.

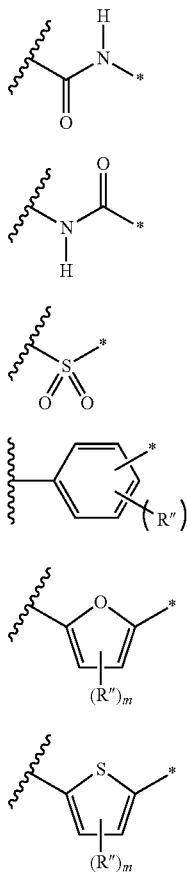

In Formulae L-1 to L-15, a wavy line portion represents a bonding position to S or another divalent linking group represented by any one of Formulae L-1 to L-15, * represents a bonding position to T or another divalent linking group represented by any one of Formulae L-1 to L-15, m in Formula L-13 represents an integer of 0 to 4, m's in Formulae L-14 and L-15 each represent an integer of 0 to 2, R"s in Formulae L-1 and L-2 each independently represent a hydrogen atom or a substituent, and R'"s in Formulae L-13, L-14, and L-15 each independently represent a substituent.

The organic semiconductor composition according to the present preferably contains a binder polymer.

The compound represented by Formula 1 and the binder polymer in the organic semiconductor composition according to the present invention is the same as the compound represented by Formula 1 and the binder polymer described above, and preferable aspects are also the same.

<Solvent Having Boiling Point of 100° C. or Higher>

The organic semiconductor composition according to the present invention contains a solvent having a boiling point of 100° C. or higher.

Examples of the solvent having a boiling point of 100° C. or higher include a hydrocarbon-based solvent such as octane, decane, toluene, xylene, mesitylene, ethylbenzene, decalin, 1-methylnaphthalene, tetralin, and dimethyltetralin, a ketone-based solvent such as methyl isobutyl ketone and cyclohexanone, a halogenized hydrocarbon-based solvent such as tetrachloroethane, chlorobenzene, dichlorobenzene, chlorotoluene, 1-fluoronaphthalene, and 1-chloronaphthalene, an ester-based solvent such as butyl acetate and amyl acetate, an alcohol-based solvent such as butanol, pentanol, hexanol, cyclohexanol, methyl cellosolve, ethyl cellosolve, and ethylene glycol, an ether-based solvent such as dibutyl ether, dioxane, anisole, 4-tertiary butyl anisole, and m-dimethoxybenzene, an amide-based solvent such as N,N-dimethylformamide and N,N-dimethylacetamide, an imide-based solvent such as 1-methyl-2-pyrrolidone and 1-methyl-2-imidazolidinone, a sulfoxide-based solvent such as dimethylsulfoxide, a nitrile-based solvent such as butyronitrile and benzonitrile.

The solvent having a boiling point of 100° C. or higher may be used singly or two or more types thereof may be used in combination.

Among these, a hydrocarbon-based solvent, a halogenized hydrocarbon-based solvent, and/or an ether-based solvent is preferable, and toluene, xylene, mesitylene, tetralin, dichlorobenzene, or anisole are more preferable. If the solvent is as described above, coating properties are excellent, and thus an organic semiconductor film can be easily formed.

The organic semiconductor composition according to the present invention may contain a solvent having a boiling point of lower than 100° C., but the content thereof is preferably less than the content of the solvent having a boiling point of 100° C. or higher, and more preferably 1/10 or less of the content of the solvent having a boiling point of 100° C. or higher. It is even more preferable that a solvent having a boiling point of less than 100° C. is not contained.

In order to obtain stability of an organic semiconductor composition and to form an even film, a boiling point of the solvent having a boiling point of 100° C. or higher in normal pressure is preferably 150° C. or higher, more preferably 175° C. or higher, and particularly preferably 200° C. or higher. In order to dry the specific solvent after an organic semiconductor ink is applied, the boiling point of the specific solvent is preferably 300° C. or lower, more preferably 250° C. or lower, and even more preferably 220° C. or lower.

The content of the solvent having a boiling point of 100° C. or higher in the organic semiconductor composition according to the present invention is preferably 50 to 99.9 mass %, more preferably 80 to 99.5 mass %, and even more preferably 90 to 99.0 mass % with respect to a total mass of the organic semiconductor composition.

The organic semiconductor composition according to the present invention may include other components in addition to the compound represented by Formula 1, the binder polymer, and the solvent.

As the components, well-known additives may be used.

The content of the component in addition to the compound represented by Formula 1, the binder polymer, and the solvent in the composition for forming the organic semiconductor according to the present invention is preferably 10 mass % or less, more preferably 5 mass % or less, even more preferably 1 mass % or less, and particularly preferably 0.1 mass % or less with respect to the total solid content. If the content is in the range described above, film formability is improved, and mobility and heat resistance of the obtained organic semiconductor are further improved. The solid content is an amount of the components excluding the volatilizable component such as the solvent.

The viscosity of the organic semiconductor composition according to the present invention is not particularly limited. However, in view of excellent coating properties, the viscosity is preferably 3 to 100 mPa·s, more preferably 5 to 50 mPa·s, and even more preferably 9 to 40 mPa·s. The viscosity according to the present invention refers to viscosity at 25° C.

As a method of measuring the viscosity, a measuring method in conformity of JIS Z8803 is preferable.

In the organic semiconductor composition according to the present invention, it is preferable that at least a portion of the compound represented by Formula 1 is dissolved, and it is more preferable that the entire compound is dissolved. However, a portion thereof may be dispersed without being dissolved.

The content of the compound represented by Formula 1 according to the present invention is preferably 20 mass % or less, more preferably 0.001 to 20 mass %, even more preferably 0.001 to 15 mass %, and particularly preferably 0.01 to 10 mass % with respect to a total amount of the organic semiconductor composition. In a case where two or more types of compound represented by Formula 1 are used together, the total content of the compound represented by Formula 1 is preferably in the range described above. If the content of the compound represented by Formula 1 is in the range described above, carrier mobility is more excellent, and preservation stability is also excellent.

The content of the compound represented by Formula 1 is preferably 30 to 99 mass %, more preferably 50 to 95 mass %, and even more preferably 70 to 90 mass % with respect to a total solid content.

The method of manufacturing the organic semiconductor composition according to the present invention is not particularly limited, and well-known methods can be applied. For example, the compound represented by Formula 1 in a predetermined amount is added to the solvent having a boiling point of 100° C. or higher, a stirring treatment can be suitably performed, so as to obtain a desired composition. In a case where the binder polymer is used, it is suitable that the compound represented by Formula 1 and the binder polymer are simultaneously or sequentially added, so as to manufacture the composition.

(Organic Semiconductor Film)

The organic semiconductor film according to the present invention contains the compound represented by Formula 1.

It is preferable that the organic semiconductor film according to the present invention is an organic semiconductor film formed from the organic semiconductor compositions according to the present invention.

The organic semiconductor film according to the present invention preferably contains the binder polymer.

The compound represented by Formula 1 and the binder polymer in the organic semiconductor film according to the present invention are the same as the compound represented by Formula 1 and the binder polymer described above in the organic semiconductor element according to the present invention and preferable aspects thereof are also the same.

The organic semiconductor film according to the present invention may include other components in addition to the compound represented by Formula 1 and the binder polymer.

As the component, well-known additives may be used.

The content of the component in addition to the compound represented by Formula 1 and the binder polymer in the organic semiconductor films according to the present invention preferably 10 mass % or less, more preferably 5 mass % or less, even more preferably 1 mass % or less, and particularly preferably 0.1 mass % or less. If the content is in the range above, film formability is improved, and mobility and heat resistance of the obtained organic semiconductor are further improved. The solid content is an amount of components other than the volatilizable components such as the solvent.

The film thickness of the organic semiconductor film according to the present invention is not particularly limited. However, in view of mobility and heat resistance of the obtained organic semiconductor, the film thickness is preferably 10 to 500 nm and more preferably 30 to 200 nm.

The organic semiconductor film according to the present invention can be suitably used in the organic semiconductor element, and can be particularly suitably used in the organic transistor (organic thin film transistor).

(Organic Semiconductor Compound)

The organic semiconductor compound according to the present invention is represented by Formula 1 below.

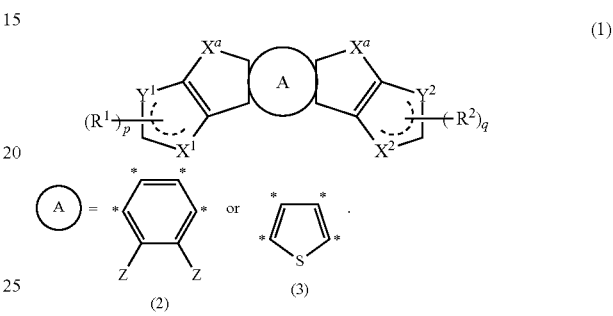

In Formula 1, A represents a central aromatic ring and is an aromatic ring selected from any one of aromatic rings represented by Formula 2 or 3, *'s represent bonding positions to two side chalcogenophene rings, and $X^a$'s represent chalcogen atoms, one of $X^1$ and $Y^1$ is a chalcogen atom and the other is $C(R^a)$, one of $X^2$ and $Y^2$ is a chalcogen atom and the other is $C(R^b)$, $R^a$'s each independently represent a hydrogen atom or $R^1$, $R^b$'s each independently represent a hydrogen atom or $R^2$, in a case where A is an aromatic ring represented by Formula 3, $Y^1$ and $Y^2$ are each independently a chalcogen atom, $X^1$ represents $C(R^a)$, and $X^2$ represents $C(R^b)$, p and q each independently represent an integer of 0 to 2, Z's each independently represent a hydrogen atom or a halogen atom, and $R^1$ and $R^2$ each independently represent a halogen atom or a group represented by Formula W below.

—S-L-T  (W)

In Formula W, S represents a single bond or —$(C(R^S)_2)_n$—, $R^S$'s each independently represent a hydrogen atom or a halogen atom, n represents an integer of 1 to 17, L represents a single bond, a divalent linking group represented by any one of Formulae L-1 to L-15 below, or a divalent linking group obtained by bonding two or more divalent linking groups represented by any one of Formulae L-1 to L-15 below, and T represents an alkyl group, a haloalkyl group, a cyano group, a vinyl group, an ethynyl group, an aryl group, a heteroaryl group, an oxyethylene group, an oligooxyethylene group in which a repetition number of oxyethylene units is 2 or greater, a siloxane group, an oligosiloxane group having two or more silicon atoms, or a trialkylsilyl group.

-continued (L-1) 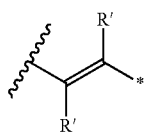

(L-2) 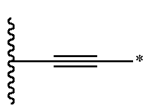

(L-3) 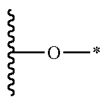

(L-4) 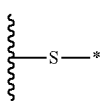

(L-5) 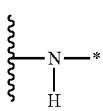

(L-6) 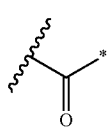

(L-7) 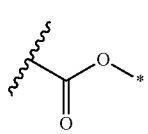

(L-8) 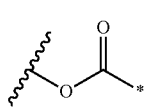

(L-9) 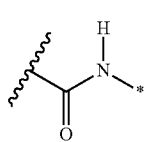

(L-10) 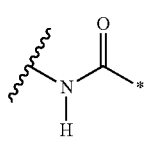

(L-11) 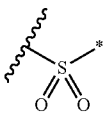

-continued (L-12) 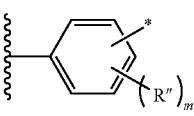

(L-13) 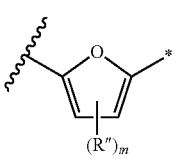

(L-14) 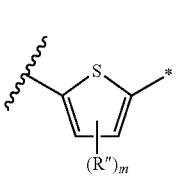

(L-15)

In Formulae L-1 to L-15, a wavy line portion represents a bonding position to S or another divalent linking group represented by any one of Formulae L-1 to L-15, * represents a bonding position to T or another divalent linking group represented by any one of Formulae L-1 to L-15, m in Formula L-13 represents an integer of 0 to 4, m's in Formulae L-14 and L-15 each represent an integer of 0 to 2, R"s in Formulae L-1 and L-2 each independently represent a hydrogen atom or a substituent, and R"'s in Formulae L-13, L-14, and L-15 each independently represent a substituent.

The compound represented by Formula 1 in the organic semiconductor compound according to the present invention is the same as the compound represented by Formula 1 described below, and the preferable aspects are the same.

In view of synthesization, examples thereof is preferably a compound represented by Formula 1-2 or 1-3 above and more preferably a compound represented by Formula 1-5 or 1-6 above.

EXAMPLES

Hereinafter, the present invention will be more specifically described based on examples. The materials and the amount thereof used, the proportion of the materials, the content and procedure of treatments, and the like described in the following examples can be appropriately changed within a scope that does not depart from the gist of the present invention. Accordingly, the scope of the present invention is not limited to the following specific examples. Herein, unless otherwise specified, "part" and "%" are based on mass.

Compounds A-1 to A-7 represented by Formula 1 and Comparative Compounds A'-1 to A'-9 which were used in examples and comparative examples are provided below.

A-1 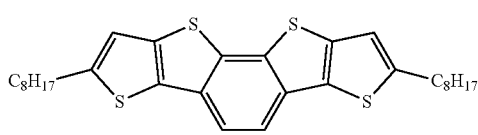
A-2 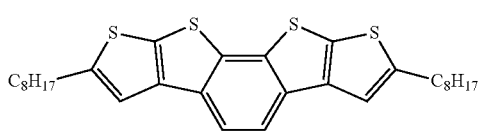
A-3 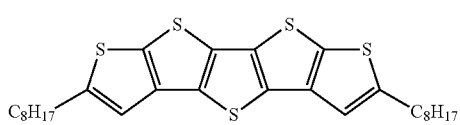
A-4 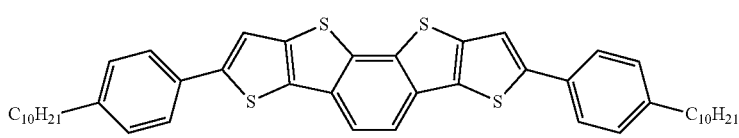
A-5 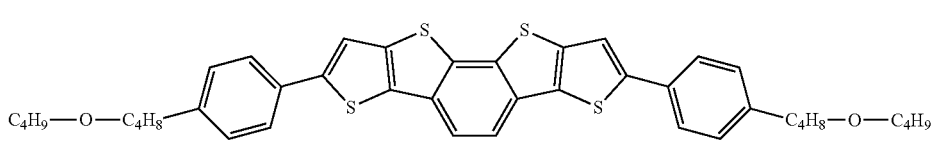
A-6 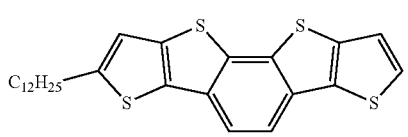
A-7 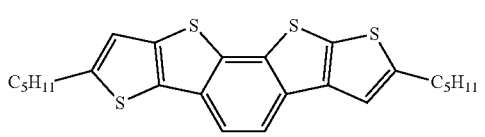
A'-1 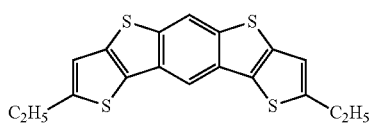
A'-2 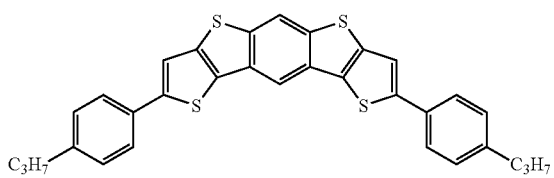
A'-3 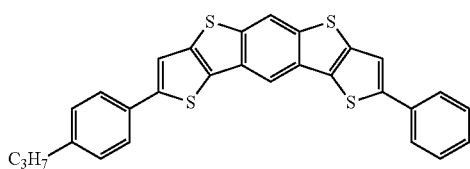
A'-4 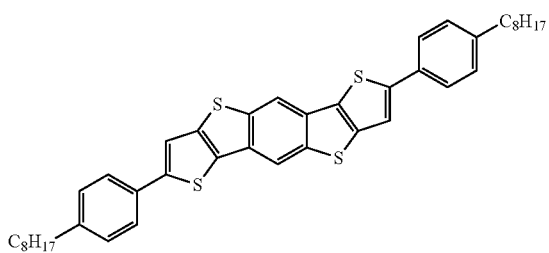
A'-5 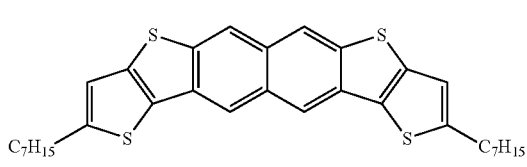
A'-6 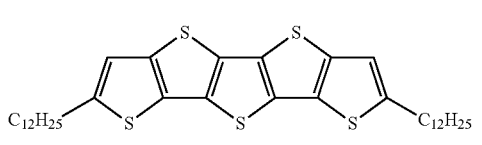
A'-7 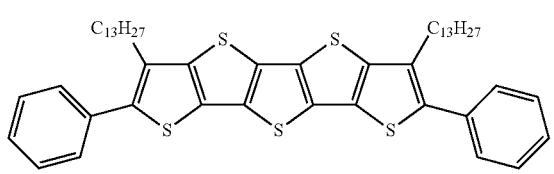

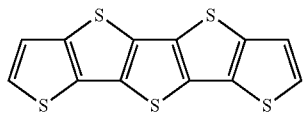

A'-8

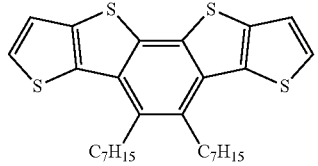

A'-9

Synthesization Example

An intermediate M1 was synthesized by Scheme X1 below.

CH₃CN: Acetonitrile (manufactured by Wako Pure Chemical Industries, Ltd.)

Pd(OAc)₂: Palladium acetate (II) (manufactured by Wako Pure Chemical Industries, Ltd.)

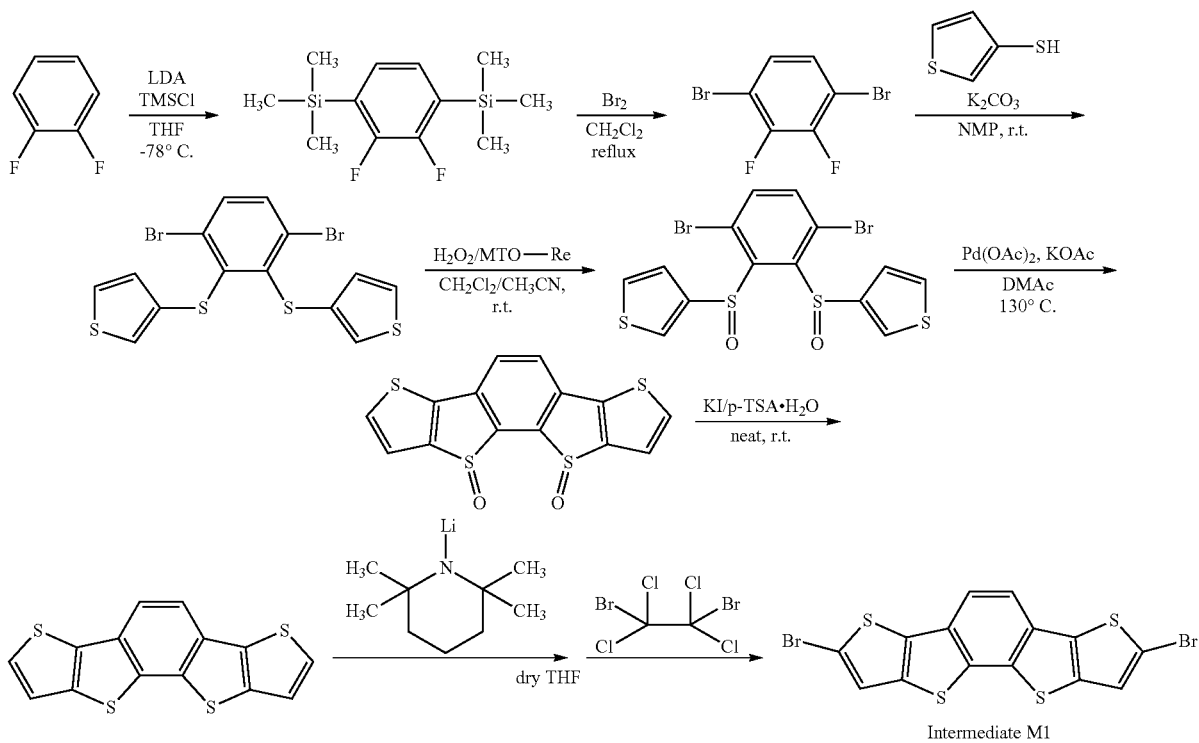

Intermediate M1

LDA: Lithium diisopropylamide (manufactured by Tokyo Chemical Industry Co., Ltd.)

TMSCl: Trimethylsilyl chloride (manufactured by Wako Pure Chemical Industries, Ltd.)

THF: Tetrahydrofuran (manufactured by Wako Pure Chemical Industries, Ltd.)

Br₂: Bromine (manufactured by Wako Pure Chemical Industries, Ltd.)

CH₂Cl₂: Dichloromethane (manufactured by Wako Pure Chemical Industries, Ltd.)

3-mercaptothiophene: manufactured by Tokyo Chemical Industry Co., Ltd.

K₂CO₃: Potassium carbonate (manufactured by Tokyo Chemical Industry Co., Ltd.)

NMP: N-methylpyrrolidone (manufactured by Kanto Chemical Co., Inc.)

H₂O₂: Hydrogen peroxide (manufactured by Kanto Chemical Co., Inc.)

MTO-Re: Methylrhenium trioxide (manufactured by Wako Pure Chemical Industries, Ltd.)

KOAc: Potassium acetate (manufactured by Wako Pure Chemical Industries, Ltd.)

DMAc: Dimethylacetamide (manufactured by Wako Pure Chemical Industries, Ltd.)

KI: Potassium iodide (manufactured by Wako Pure Chemical Industries, Ltd.)

p-TSA.H₂O: p-toluenesulfonic acid monohydrate (manufactured by Wako Pure Chemical Industries, Ltd.)

Lithium 2,2,6,6-tetramethylpiperidide: Synthesized by dissolving tetramethylpiperidine (manufactured by Wako Pure Chemical Industries, Ltd.) in THF and dropwise adding n-butyllithium (manufactured by Kanto Chemical Co., Inc.) at 0° C.

1,2-dibromo-1,1,2,2-tetrachloroethane: manufactured by Wako Pure Chemical Industries, Ltd.

Dry THF: Dry tetrahydrofuran (manufactured by Wako Pure Chemical Industries, Ltd.)

An intermediate 2 below was synthesized in the same manner as the third process of Scheme X1 above except for using 2-mercaptothiophene instead of 3-mercaptothiophene.

Intermediate M2

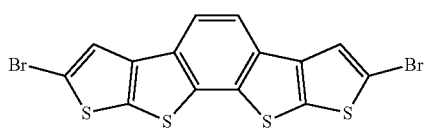

An intermediate 3 below was synthesized in the same manner as the third process of Scheme X1 above except for using 2,5-dibromo-3,4-difluorothiophene instead of 1,4-dibromo-2,3-difluorobenzene and using 2-mercaptothiophene instead of 3-mercaptothiophene. 2,5-Dibromo-3,4-difluorothiophene was synthesized in a method disclosed in Journal of the American Chemical Society, 2001, vol. 123, #19, p. 4643-4644.

Intermediate M3

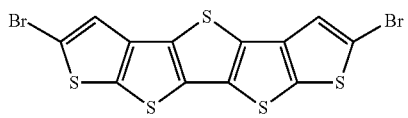

A compound A-1 used in Example 1 was synthesized by Scheme X2 below.

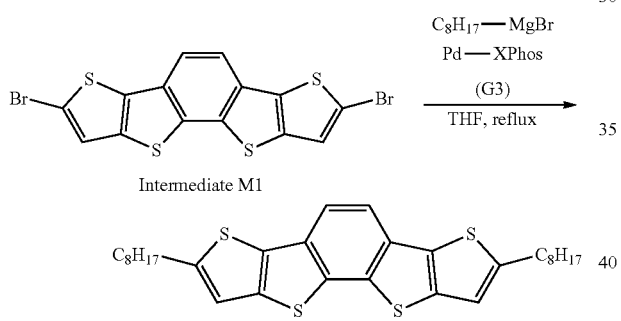

Pd-XPhos (G3): (2-Dicyclohexylphosphino-2',4',6'-triisopropyl-1,1'-biphenyl)[2-(2'-amino-1,1'-biphenyl)] palladium(II) methanesulfonate (manufactured by Sigma-Aldrich Co. LLC.)

A compound A-2 used in Example 2 was synthesized by using an intermediate 2 instead of the intermediate 1 in Scheme X2 above.

A compound A-3 used in Example 3 was synthesized in the same manner as Scheme X2 above except for using an intermediate 3 instead of the intermediate 1.

A compound A-4 used in Example 4 was synthesized by Scheme X3 below.

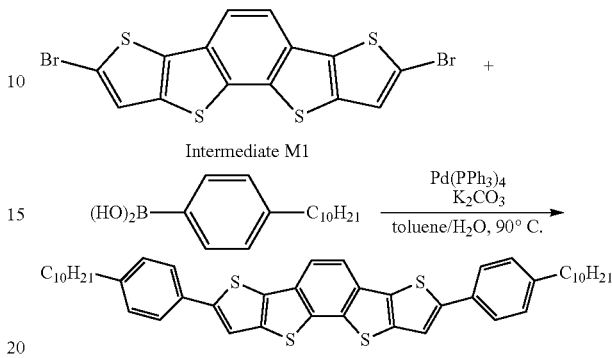

Pd(PPh$_3$)$_4$: Tetrakistriphenylphosphine palladium (0) (manufactured by Tokyo Chemical Industry Co., Ltd.)

A compound A-5 used in Example 5 was synthesized in the same manner as Scheme X3 above except for using 4-(4-butoxybutyl) phenylboronic acid instead of 4-dodecylphenylboronic acid.

A compound A-6 used in Example 6 was synthesized by Scheme X4 below by synthesizing an intermediate M4 below by using equal amounts of Li-TMP and 1,1,2,2-tetrachloro-1,2-dibromoethane used in the final step of Scheme X1 above in the half amount used in the synthesization of the intermediate 1 and using an obtained intermediate M4.

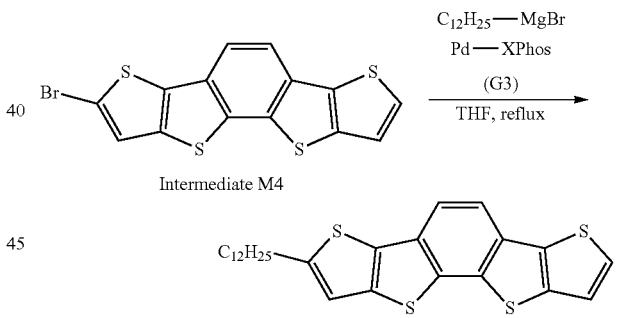

A compound A-7 used in Example 7 was synthesized by Scheme X5 below.

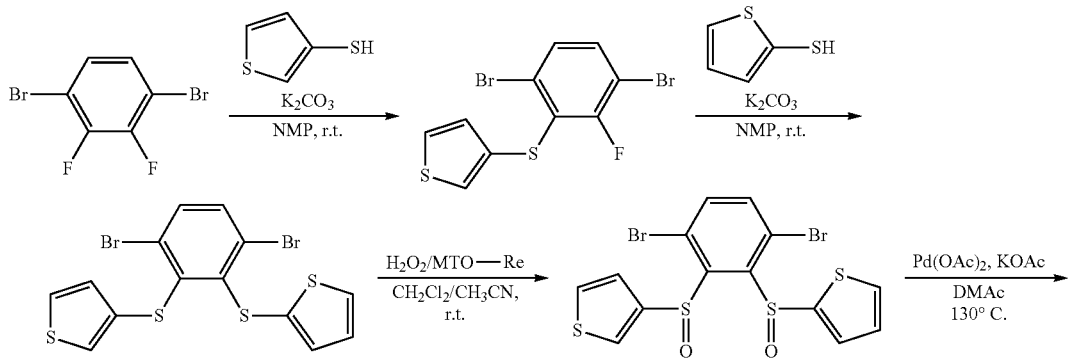

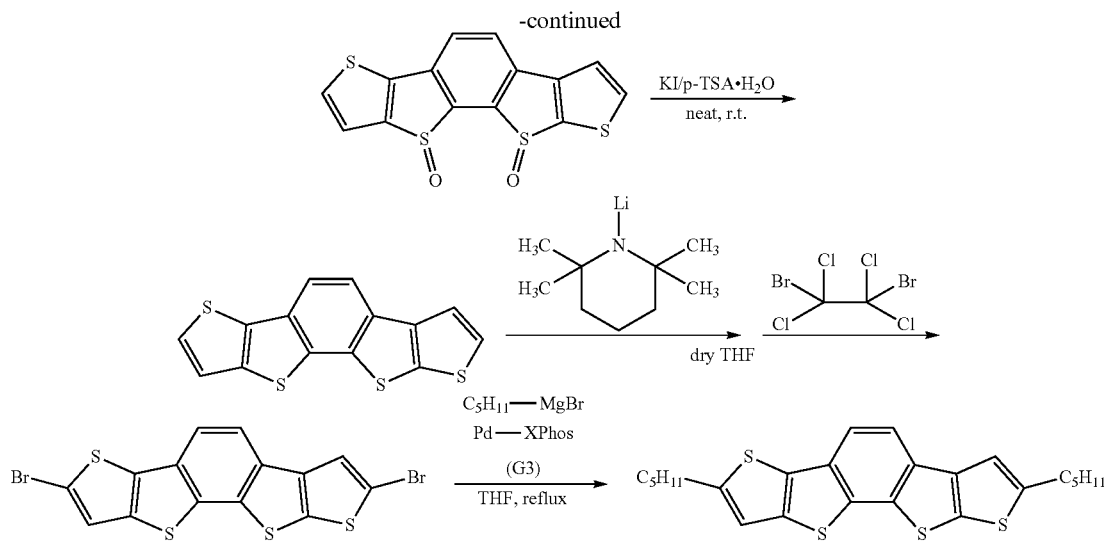

Examples 1 to 7 and Comparative Examples 1 to 9

<Manufacturing of FET Elements>

Compounds (each 1 mg) presented in Table 11 and toluene (1 mL) were mixed and heated to 100° C., so as to obtain an organic semiconductor composition. Under the nitrogen atmosphere, this composition was casted to a substrate for measuring FET characteristics heated to 90° C. under nitrogen atmosphere so as to form an organic semiconductor film (thickness: 200 nm), and an organic thin film transistor element for measuring FET characteristics was obtained. As the substrate for measuring FET characteristics, a silicon substrate in a bottom gate•bottom contact structure including chromium/gold (gate width W=100 mm, gate length L=100 μm) arranged in a comb-shape as source and drain electrodes and $SiO_2$ (film thickness: 200 nm) as an insulating film was used.

<Evaluation of Carrier Mobility>

With respect to the FET characteristics of the organic thin film transistor elements of the respective examples and the respective comparative examples, carrier mobility was evaluated under normal pressure and the nitrogen atmosphere by employing a semiconductor parameter analyzer (manufactured by Agilent, 4156C) to which a semi automatic prober (manufactured by Vector Semiconductor Co., Ltd., AX-2000) was connected.

Carrier mobility μ was calculated by applying a voltage of −80V between source electrodes-drain electrodes of the respective organic thin film transistor elements (FET elements), changing gate voltages in the range of +20 V to −100 V, and using an equation below indicating a drain current $I_d$.

$$I_d = (w/2L)\mu C_i(V_g - V_{th})^2$$

In the equation, L represents a gate length, w represents a gate width, $C_i$ represents capacity per unit area of an insulating layer, $V_g$ represents a gate voltage, and $V_{th}$ represents a threshold voltage.

<Coating Film Formability Evaluation>

The compounds (each 1 mg) presented in Table 11 and toluene (1 mL) were mixed and heated to 100° C., so as to obtain organic semiconductor compositions. Under the nitrogen atmosphere, these compositions were casted to entire surfaces of substrates on which channels for 50 elements were formed and which were heated to 90° C. so as to form organic semiconductor thin films, and 50 elements of organic thin film transistor elements for measuring FET characteristics were obtained.

—Evaluation Standard—

Coating film formability A: 45 or more (90% or greater) elements were driven as TFT elements among the obtained 50 elements.

Coating film formability B: Less than 45 (less than 90%) elements were driven as TFT elements among the obtained 50 elements.

<Evaluation of Qualities of Coating Film>

Qualities of the coating film were evaluated by the method described below.

With respect to the semiconductor active layer of the organic thin film transistor element, a domain size was measured using a polarizing microscope in the range of 1 mm square, so as to calculate an average domain size. The obtained result was evaluated in five stages below. In practice, Evaluation D does not have problems, but Evaluation A, B, or C is preferable, Evaluation A or B is more preferable, and Evaluation A is particularly preferable.

A: An average domain size is greater than 5 micrometers.

B: An average domain size is greater than 1 micrometer and 5 micrometers or less.

C: An average domain size is greater than 0.5 micrometers and 1 micrometer or less.

D: An average domain size is 0.5 micrometers or less.

E: A film was not continuous and evaluation was not able to be performed.

<Heat Resistance Evaluation>

After the manufactured respective organic thin film transistor elements were heated for one hour at 130° C. in a nitrogen glove box, carrier mobility μ was measured, so as to calculate a carrier mobility maintenance rate after heating by the equation below.

Carrier mobility maintenance rate after heating (%)=Mobility (after heating)/Mobility (initial value)

Obtained results were evaluated according to evaluation standards below.

—Evaluation Standard—
A: 95% or greater.
B: 70% or greater and less than 95%.
C: 40% or greater and less than 70%.
D: 20% or greater and less than 40%.
E: Less than 20%.

<Fold Resistance (Flexibility) Evaluation>

Each organic thin film transistor element that was manufactured on a polyethylene naphthalate (PEN) film (TEONEX 65H manufactured by Teijin DuPont Films Japan Limited) was subjected to a 100 times folding test with a curvature radius of four millimeters, carrier mobility μ was measured, a carrier mobility maintenance rate after the folding test was calculated by an equation below.

Carrier mobility maintenance rate (%) after folding test=mobility (after folding)/mobility (initial value)

The obtained result was evaluated according to the evaluation standard below.

—Evaluation Standard—
A: 95% or greater
B: 90% or greater and less than 95%
C: Less than 90%

In practice, Evaluation A or B is required, and Evaluation A is preferable.

TABLE 11

|  | Compound | Mobility (Toluene solution) | Coating film formability | Quality of coating film | Heat resistance | Fold resistance |
|---|---|---|---|---|---|---|
| Example 1 | A-1 | 0.51 | A | A | A | A |
| Example 2 | A-2 | 0.23 | A | A | A | A |
| Example 3 | A-3 | 0.15 | A | A | A | A |
| Example 4 | A-4 | $7 \times 10^{-2}$ | A | B | A | A |
| Example 5 | A-5 | $5 \times 10^{-2}$ | A | B | A | B |
| Example 6 | A-6 | $2 \times 10^{-2}$ | A | C | B | A |
| Example 7 | A-7 | $1 \times 10^{-2}$ | A | C | B | B |
| Comparative Example 1 | A'-1 | $2 \times 10^{-4}$ | B | D | C | C |
| Comparative Example 2 | A'-2 | $3 \times 10^{-5}$ | B | D | C | D |
| Comparative Example 3 | A'-3 | No TFT Characteristics | B | D | C | D |
| Comparative Example 4 | A'-4 | No TFT Characteristics | B | E | N/A | N/A |
| Comparative Example 5 | A'-5 | No TFT Characteristics | B | E | N/A | N/A |
| Comparative Example 6 | A'-6 | No TFT Characteristics | B | E | N/A | N/A |
| Comparative Example 7 | A'-7 | No TFT Characteristics | B | D | N/A | N/A |
| Comparative Example 8 | A'-8 | No TFT Characteristics | B | E | N/A | N/A |
| Comparative Example 9 | A'-9 | No TFT Characteristics | B | E | N/A | N/A |

In Table 11 and Table 12 provided below, N/A represents that evaluation was not able to be performed, since TFT characteristics were not provided, and mobility was not able to be measured.

Examples 8 to 11, and Comparative Examples 10 and 11: Binder Polymer Addition Example The organic semiconductor compositions and the organic thin film transistor elements of Examples 8 to 11 and Comparative Examples 10 and 11 were manufactured in the same manner as Examples 1 to 7 and Comparative Examples 1 to 9 except for mixing Compounds in Table 12 or Comparative Compounds (each 1 mg), 1 mg of PαMS (poly(α-methylstyrene), Mw=300,000, manufactured by Sigma-Aldrich Co. LLC.), and toluene (1 mL), heating the same to 100° C., and using the resultant as a coating solution, and various evaluations were performed. Evaluation results are presented in Table 12.

TABLE 12

| | Compound | Binder polymer | Mobility (Toluene solution) | Coating film formability | Quality of coating film | Heat resistance | Fold resistance |
|---|---|---|---|---|---|---|---|
| Example 8 | A-1 | PαMS | 0.75 | A | A | A | A |
| Example 9 | A-1 | PαMS | 0.3 | A | A | A | A |
| Example 10 | A-1 | PαMS | 0.22 | A | A | A | A |
| Example 11 | A-5 | PαMS | $1.2 \times 10^{-1}$ | A | A | A | A |
| Comparative Example 10 | A'-5 | PαMS | No TFT Characteristics | B | E | N/A | N/A |
| Comparative Example 11 | A'-9 | PαMS | No TFT Characteristics | B | E | N/A | N/A |

Examples 12 to 22 and Comparative Examples 12 to 22: Ink Jet Coating

The organic semiconductor composition manufactured for the coating film formability evaluation was applied to a substrate for measuring FET characteristics by an ink jet printing. Specifically, DPP2831 (manufactured by FUJIFILM Global Graphic Systems Co., Ltd.) was used as an inkjet device and 10 pL heads were used, so as to form a solid film with a jetting frequency of 2 Hz and a pitch between dots of 20 μm. Thereafter, drying was performed for one hour at 70° C., so as to form an organic semiconductor film, and the organic TFT element for measuring FET characteristics was obtained.

In the examples and the comparative examples, all of the evaluations of carrier mobility, coating film formability, heat resistance, and folding resistance described below with respect to the organic TFT elements that were able to be obtained by ink jet printing were the same as the evaluations of the organic TFT elements that were able to be obtained by a cast method.

Even in a case where the organic semiconductor film was patterned in a channel area by an ink jet method, performances were the same as in the element manufactured by a cast method or a solid film element manufactured by an ink jet method.

Examples 23 to 33 and Comparative Examples 23 to 33: Flexographic Printing

The substrate above on which source-drain electrodes were formed was coated with the organic semiconductor composition manufactured in the coating film formability evaluation above by a flexographic printing method. As the printing device, a flexographic printability test machine F1 (manufactured by IGT Testing Systems) was used as a printing machine, and AFP DSH 1.70% (manufactured by Asahi Kasei Corporation)/a solid image was used as a flexographic resin version. After printing was performed in a pressure between a plate and a substrate of 60 N and a transportation speed of 0.4 m/second, drying was performed at 40° C. for two hours, so as to manufacture a semiconductor active layer.

With respect to the respective examples or comparative examples, all of the evaluations of carrier mobility, coating film formability, heat resistance, and folding resistance of the organic TFT elements that were able to be obtained by a flexographic printing described below were the same as the evaluations of the organic TFT elements that were able to be obtained by a cast method.

Example 34

The organic semiconductor composition and the organic thin film transistor element were manufactured in the same manner as in Examples 1 to 33 except for using anisole or tetralin instead of toluene as the solvent, respectively, and evaluation was performed. Characteristics and evaluation results which were the same as those in the corresponding examples were able to be obtained.

EXPLANATION OF REFERENCES

10: substrate
20: gate electrode
30: gate insulating film
40: source electrode
42: drain electrode
50: organic semiconductor film
60: sealing layer
100, 200: organic thin film transistor

What is claimed is:
1. An organic semiconductor element comprising:
a compound represented by Formula 1 below in a semiconductor active layer,

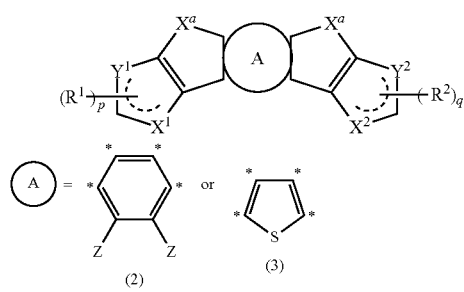

in Formula 1, A represents a central aromatic ring and is an aromatic ring selected from any one of aromatic rings represented by Formula 2 or 3, *'s represent bonding positions to two side chalcogenophene rings, and $X^a$'s represent chalcogen atoms, one of $X^1$ and $Y^1$ is a chalcogen atom and the other is $C(R^a)$, one of $X^2$ and $Y^2$ is a chalcogen atom and the other is $C(R^b)$, $R^a$'s each independently represent a hydrogen atom or $R^1$, $R^b$'s each independently represent a hydrogen atom or $R^2$, in a case where A is an aromatic ring represented by Formula 3, $Y^1$ and $Y^2$ are each independently a chalcogen atom, $X^1$ is $C(R^a)$, and $X^2$ is $C(R^b)$, p and q each independently represent an integer of 0 to 2, Z's each independently represent a hydrogen atom or a halogen atom, and $R^1$ and $R^2$ each independently represent a halogen atom or a group represented by Formula W below, $$-S-L-T \qquad (W)$$

in Formula W, S represents a single bond or $-(C(R^S)_2)_n-$, $R^S$'s each independently represent a hydrogen atom or a halogen atom, n represents an integer of 1 to 17, L represents a single bond, a divalent linking group represented by any one of Formulae L-1 to L-15 below, or a divalent linking group obtained by bonding two or more divalent linking groups represented by any one of Formulae L-1 to L-15 below, and T represents an alkyl group, a haloalkyl group, a cyano group, a vinyl group, an ethynyl group, an aryl group, a heteroaryl group, an oxyethylene group, an oligooxyethylene group in which a repetition number of oxyethylene units is two or greater, a siloxane group, an oligosiloxane group having two or more silicon atoms, or a trialkylsilyl group, and

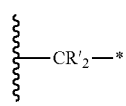 (L-1)

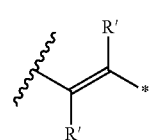 (L-2)

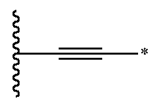 (L-3)

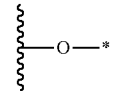 (L-4)

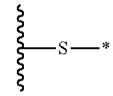 (L-5)

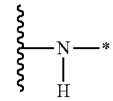 (L-6)

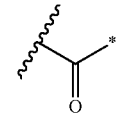 (L-7)

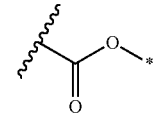 (L-8)

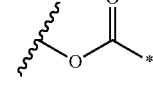 (L-9)

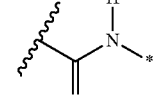 (L-10)

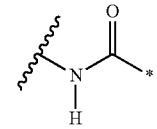 (L-11)

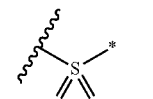 (L-12)

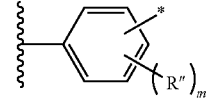 (L-13)

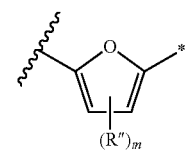 (L-14)

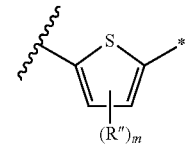 (L-15)

in Formulae L-1 to L-15, a wavy line portion represents a bonding position to S or another divalent linking group represented by any one of Formulae L-1 to L-15,

* represents a bonding position to T or another divalent linking group represented by any one of Formulae L-1 to L-15, m in Formula L-13 represents an integer of 0 to 4, m's in Formulae L-14 and L-15 each represent an integer of 0 to 2, R"s in Formulae L-1 and L-2 each independently represent a hydrogen atom or a substituent, and R'''s in Formulae L-13, L-14, and L-15 each independently represent a substituent.

2. The organic semiconductor element according to claim 1, wherein both of $X^1$ and $X^2$ are chalcogen atoms, or both of $Y^1$ and $Y^2$ are chalcogen atoms.

3. The organic semiconductor element according to claim 1, wherein Z is a hydrogen atom.

4. The organic semiconductor element according to claim 1, wherein p and q are each independently 1 or 2.

5. The organic semiconductor element according to claim 1, wherein both of p and q are 1.

6. The organic semiconductor element according to claim 5, wherein substitution positions of $R^1$ and $R^2$ are respectively second positions of terminal chalcogenophene rings.

7. The organic semiconductor element according to claim 1, wherein $X^a$ is a S atom.

8. The organic semiconductor element according to claim 1, wherein both of two terminal chalcogenophene rings in Formula 1 are thiophene rings.

9. The organic semiconductor element according to claim 1, wherein a sum of the numbers of carbon atoms in the group represented by Formula W is 4 to 40.

10. The organic semiconductor element according to claim 1, wherein L is a divalent linking group represented by any one of Formulae L-1 to L-4 and L-13 to L-15, or a divalent linking group obtained by bonding two or more divalent linking groups represented by any one of Formulae L-1 to L-4 and L-13 to L-15.

11. The organic semiconductor element according to claim 1, wherein L is a divalent linking group represented by any one of Formulae L-1 to L-4 and L-13 to L-15 singly.

12. The organic semiconductor element according to claim 1, wherein T is an alkyl group.

13. The organic semiconductor element according to claim 1, wherein W is an alkyl group.

14. The organic semiconductor element according to claim 1, which is an organic thin film transistor.

15. An organic semiconductor composition comprising:
a compound represented by Formula 1 below; and
a solvent having a boiling point of 100° C. or higher,
wherein a content of the compound represented by Formula 1 is 20 mass % or less with respect to a total amount of the organic semiconductor composition,

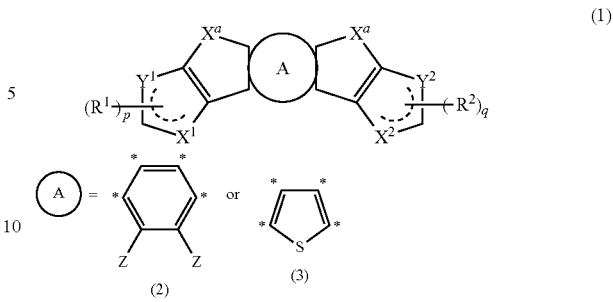

in Formula 1, A represents a central aromatic ring and is an aromatic ring selected from any one of aromatic rings represented by Formula 2 or 3, *'s represent bonding positions to two side chalcogenophene rings, and $X^a$'s represent chalcogen atoms, one of $X^1$ and $Y^1$ is a chalcogen atom and the other is $C(R^a)$, one of $X^2$ and $Y^2$ is a chalcogen atom and the other is $C(R^b)$, $R^a$'s each independently represent a hydrogen atom or $R^1$, $R^b$'s each independently represent a hydrogen atom or $R^2$, in a case where A is an aromatic ring represented by Formula 3, $Y^1$ and $Y^2$ are each independently a chalcogen atom, $X^1$ is $C(R^a)$, and $X^2$ is $C(R^b)$, p and q each independently represent an integer of 0 to 2, Z's each independently represent a hydrogen atom or a halogen atom, and $R^1$ and $R^2$ each independently represent a halogen atom or a group represented by Formula W below,

—S-L-T  (W)

in Formula W, S represents a single bond or —(C($R^S$)$_2$)$_n$—, $R^S$'s each independently represent a hydrogen atom or a halogen atom, n represents an integer of 1 to 17, L represents a single bond, a divalent linking group represented by any one of Formulae L-1 to L-15 below, or a divalent linking group obtained by bonding two or more divalent linking groups represented by any one of Formulae L-1 to L-15 below, and T represents an alkyl group, a haloalkyl group, a cyano group, a vinyl group, an ethynyl group, an aryl group, a heteroaryl group, an oxyethylene group, an oligooxyethylene group in which a repetition number of oxyethylene units is two or greater, a siloxane group, an oligosiloxane group having two or more silicon atoms, or a trialkylsilyl group, and

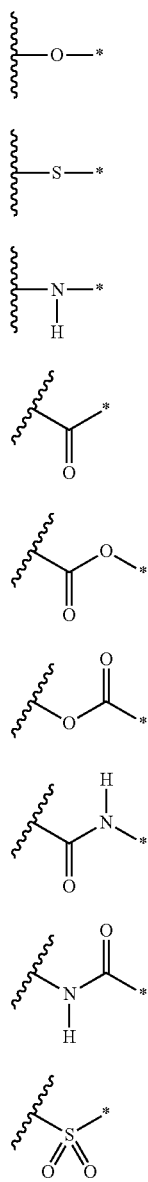
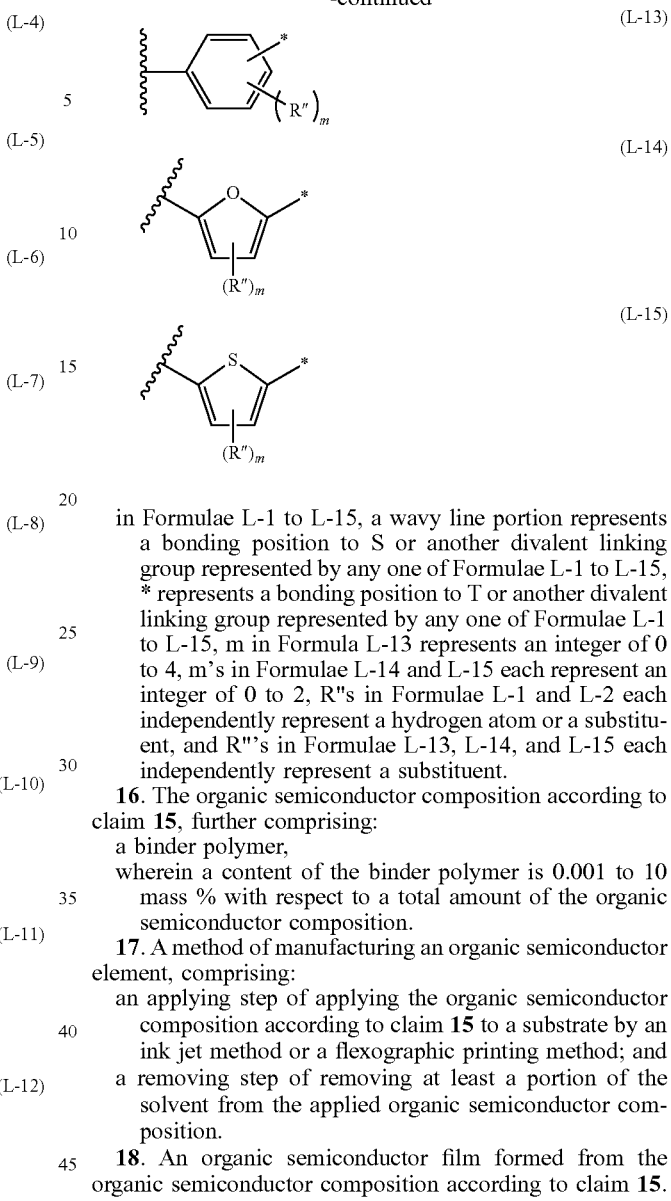

in Formulae L-1 to L-15, a wavy line portion represents a bonding position to S or another divalent linking group represented by any one of Formulae L-1 to L-15, * represents a bonding position to T or another divalent linking group represented by any one of Formulae L-1 to L-15, m in Formula L-13 represents an integer of 0 to 4, m's in Formulae L-14 and L-15 each represent an integer of 0 to 2, R"s in Formulae L-1 and L-2 each independently represent a hydrogen atom or a substituent, and R"'s in Formulae L-13, L-14, and L-15 each independently represent a substituent.

16. The organic semiconductor composition according to claim 15, further comprising:
a binder polymer,
wherein a content of the binder polymer is 0.001 to 10 mass % with respect to a total amount of the organic semiconductor composition.

17. A method of manufacturing an organic semiconductor element, comprising:
an applying step of applying the organic semiconductor composition according to claim 15 to a substrate by an ink jet method or a flexographic printing method; and
a removing step of removing at least a portion of the solvent from the applied organic semiconductor composition.

18. An organic semiconductor film formed from the organic semiconductor composition according to claim 15.

* * * * *